US008853660B2

(12) United States Patent
Han et al.

(10) Patent No.: US 8,853,660 B2
(45) Date of Patent: Oct. 7, 2014

(54) SEMICONDUCTOR MEMORY DEVICES HAVING LOWER AND UPPER INTERCONNECTIONS, SELECTION COMPONENTS AND MEMORY COMPONENTS

(71) Applicant: Samsung Electronics Co., Ltd., Suwon-si (KR)

(72) Inventors: JaeJong Han, Seoul (KR); Sungun Kwon, Gyeonggi-do (KR); Jinhye Bae, Gyeonggi-do (KR); Kongsoo Lee, Gyeonggi-do (KR); Seong Hoon Jeong, Gyeonggi-do (KR); Yoongoo Kang, Gyeonggi-do (KR); Ho-Kyun An, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 52 days.

(21) Appl. No.: 13/668,489

(22) Filed: Nov. 5, 2012

(65) Prior Publication Data

US 2013/0146830 A1    Jun. 13, 2013

(30) Foreign Application Priority Data

Dec. 7, 2011    (KR) ......................... 10-2011-0130376

(51) Int. Cl.
*H01L 29/02*    (2006.01)
(52) U.S. Cl.
USPC ..... 257/2; 257/3; 257/4; 257/5; 257/E29.002; 438/102; 438/103; 438/104; 365/163
(58) Field of Classification Search
CPC ......... H01L 45/04; H01L 29/00; H01L 27/24; G11C 13/0004

USPC ................. 257/1–5, E29.002; 438/102–104; 365/163
See application file for complete search history.

(56) References Cited

U.S. PATENT DOCUMENTS

| | | | | |
|---|---|---|---|---|
| 5,060,035 A | * | 10/1991 | Nishimura et al. | 257/351 |
| 5,143,860 A | * | 9/1992 | Mitchell et al. | 438/262 |
| 5,356,834 A | * | 10/1994 | Sugimoto et al. | 438/624 |
| 5,670,803 A | * | 9/1997 | Beilstein et al. | 257/278 |
| 5,811,340 A | * | 9/1998 | Park | 438/291 |
| 5,821,143 A | * | 10/1998 | Kim et al. | 438/267 |
| 5,977,584 A | * | 11/1999 | Kim | 257/315 |
| 6,969,633 B2 | | 11/2005 | Dennison | |
| 7,351,992 B2 | | 4/2008 | Scheuerlein | |

(Continued)

FOREIGN PATENT DOCUMENTS

| | | |
|---|---|---|
| KR | 1020080039701 A | 7/2008 |
| KR | 1020090060593 A | 6/2009 |
| KR | 1020100032582 A | 3/2010 |
| KR | 1020100052313 A | 5/2010 |

*Primary Examiner* — Jami M Valentine
(74) *Attorney, Agent, or Firm* — Myers Bigel Sibley & Sajovec, P.A.

(57) ABSTRACT

Semiconductor devices include lower interconnections, upper interconnections crossing over the lower interconnections, selection components disposed at crossing points of the lower interconnections and the upper interconnections, respectively, and memory components disposed between the selection components and the upper interconnections. Each of the selection components may include a semiconductor pattern having a first sidewall and a second sidewall. The first sidewall of the semiconductor pattern may have a first upper width and a first lower width that is greater than the first upper width. The second sidewall of the semiconductor pattern may have a second upper width and a second lower width that is substantially equal to the second upper width.

14 Claims, 21 Drawing Sheets

(56) References Cited

U.S. PATENT DOCUMENTS

| | | |
|---|---|---|
| 7,612,360 B2 * | 11/2009 | Lee et al. ............ 257/3 |
| 7,745,812 B2 | 6/2010 | Happ et al. |
| 7,883,958 B2 | 2/2011 | Park |
| 7,955,958 B2 | 6/2011 | Rajendran et al. |
| 2002/0052086 A1 * | 5/2002 | Maeda .............. 438/283 |
| 2002/0079536 A1 * | 6/2002 | Terauchi et al. ......... 257/332 |
| 2010/0061140 A1 * | 3/2010 | Klostermann et al. ....... 365/148 |
| 2012/0313067 A1 * | 12/2012 | Lee et al. ............ 257/2 |

* cited by examiner

SEMICONDUCTOR MEMORY DEVICES HAVING LOWER AND UPPER INTERCONNECTIONS, SELECTION COMPONENTS AND MEMORY COMPONENTS

CROSS-REFERENCE TO RELATED APPLICATION

This U.S. non-provisional patent application claims priority under 35 U.S.C. §119 to Korean Patent Application No. 10-2011-0130376 filed on Dec. 7, 2011, the entire content of which is incorporated by reference herein.

BACKGROUND

The inventive concept relates to semiconductor devices and methods of manufacturing the same and, more particularly, to semiconductor devices with improved integration density and methods of manufacturing such devices.

Semiconductor devices have become more highly integrated with the development of the electronics industry. However, various problems may occur when the integration level of a semiconductor device is increased by simply scaling down the components thereof. For example, when minimum widths of semiconductor devices are reduced to be in the range of, for example, several tens of nanometers, the margins for the manufacturing processes that are used to form such semiconductor devices may be quite small. Additionally, as the size of semiconductor devices are reduced further, it may become more difficult to optimize the characteristics of various components (e.g., various driving circuits and/or a memory cell, etc.) of the semiconductor device.

SUMMARY

Embodiments of the inventive concept may provide semiconductor devices with improved integration density and reliability.

Embodiments of the inventive concept may provide methods of manufacturing semiconductor devices with improved integration density and reliability.

In one aspect, a semiconductor device may include: lower interconnections; upper interconnections that cross over the lower interconnections; selection components disposed at crossing points of the lower interconnections and the upper interconnections, respectively; and memory components disposed between the selection components and the upper interconnections. Each of the selection components may include a semiconductor pattern having a first sidewall and a second sidewall. The first sidewall of each semiconductor pattern may have a first upper width and a first lower width that is greater than the first upper width. The second sidewall of each semiconductor pattern may have a second upper width and a second lower width that is substantially equal to the second upper width.

In another aspect, a method of manufacturing a semiconductor device may include: forming mold patterns that define a plurality of trenches on or in a semiconductor substrate; forming a plurality of pairs of sacrificial lines that respectively cover inner sidewalls of each of the trenches, each pair of sacrificial lines separated from each other; forming a first filling layer filling the trenches between the sacrificial lines; forming second filling patterns crossing the sacrificial lines, thereby forming sacrificial patterns two-dimensionally arranged on the semiconductor substrate; removing the sacrificial patterns to form openings exposing the semiconductor substrate; and forming semiconductor patterns grown from the semiconductor substrate exposed by the openings.

BRIEF DESCRIPTION OF THE DRAWINGS

The inventive concept will become more apparent in view of the attached drawings and accompanying detailed description.

DETAILED DESCRIPTION OF THE EMBODIMENTS

Figure 1:
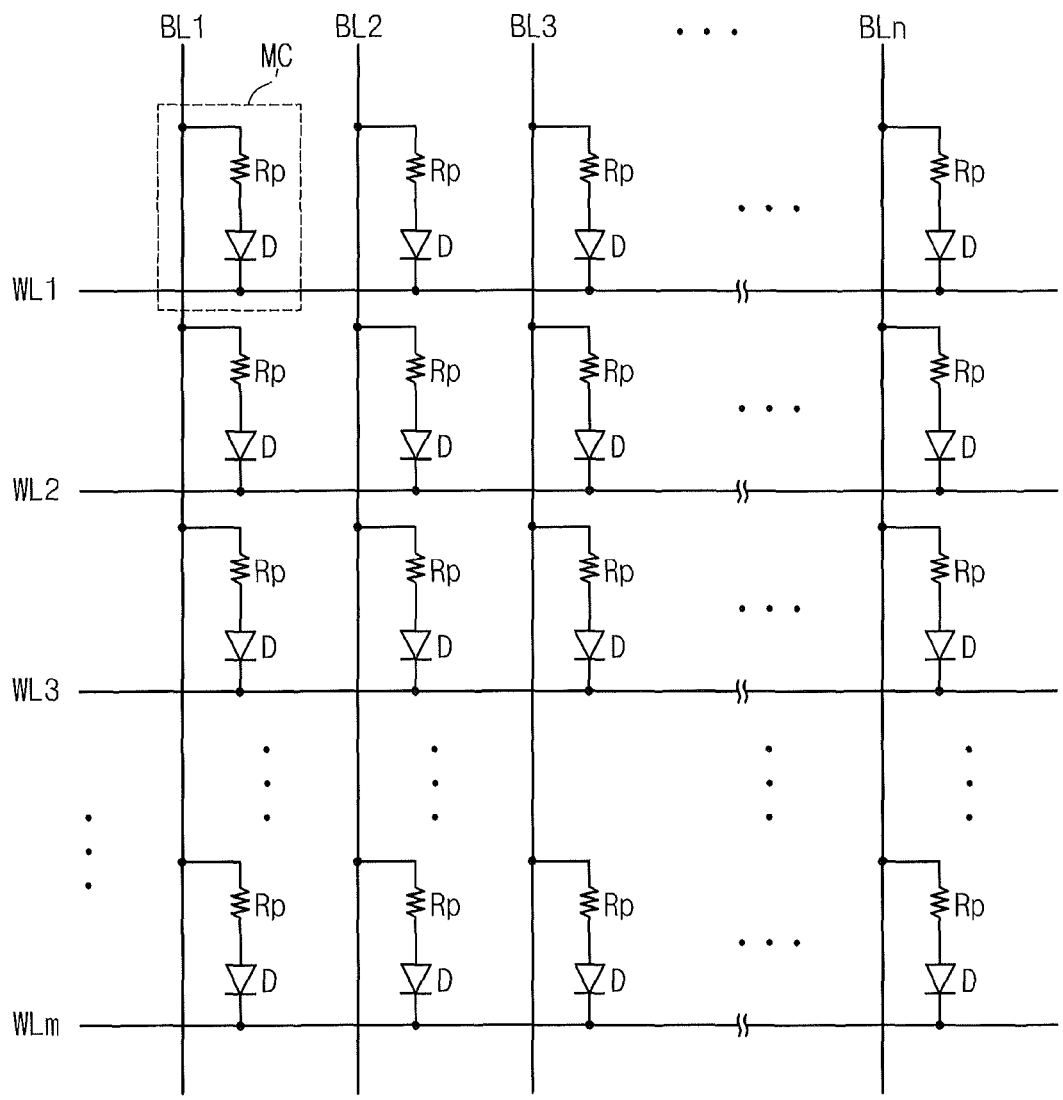
FIG. 1 is a schematic circuit diagram illustrating a memory cell array of a semiconductor device according to embodiments of the inventive concept.

The inventive concept will now be described more fully hereinafter with reference to the accompanying drawings, in which example embodiments of the inventive concept are shown. The advantages and features of the inventive concept and methods of achieving them will be apparent from the following example embodiments that will be described in more detail with reference to the accompanying drawings. It should be noted, however, that the inventive concept is not limited to the following example embodiments, and may be implemented in various forms. Accordingly, the example embodiments are provided only to disclose the inventive concept. In the drawings, embodiments of the inventive concept are not limited to the specific examples provided herein and the size of various regions, layers, components and the like in the drawings may be exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present. Likewise, it will be understood that when an element such as a layer, region or substrate is referred to as being "on" another element, it can be directly on the other element or intervening elements may be present. In contrast, the term "directly" means that there are no intervening elements. It will be further understood that the terms "comprises," "comprising," "includes" and/or "including," when used herein, specify the presence of stated features, steps, operations, elements, and/or components, but do not preclude the presence or addition of one or more other features, steps, operations, elements, components, and/or groups thereof.

Additionally, the embodiments in the detailed description will be described with reference to perspective views of the inventive concept. It will be appreciated that shapes of the various elements, layers, components and the like in these example views may differ from what is shown in the drawings based on the manufacturing techniques used and/or allowable tolerances, errors or the like. Therefore, it will be appreciated that the embodiments of the inventive concept are not limited to the specific shapes illustrated in the drawings, but may include other shapes that result from, for example, the manufacturing processes that are used. Areas exemplified in the drawings have general properties, and are used to illustrate specific shapes of elements. Thus, the drawings should not be construed as limiting with respect to the scope of the inventive concept.

It will be also understood that although the terms first, second, third, etc. may be used herein to describe various elements, these elements are not limited by these terms. Instead, these terms are only used to distinguish one element from another element. Thus, a first element in some embodiments could be termed a second element in other embodiments without departing from the teachings of the present invention. Example embodiments of aspects of the present inventive concept explained and illustrated herein include their complementary counterparts. The same reference numerals or designators denote the same elements throughout the specification.

Hereinafter, embodiments of the inventive concept will be described using a phase change random access memory (PRAM) device as an example. However, the inventive concept is not limited thereto. For example, embodiments of the inventive concept may be applied to a memory device using a resistor, such as a resistive random access memory (RRAM) device, a magnetic random access memory (MRAM) device, and/or a ferroelectric random access memory (FRAM) device. Alternatively, embodiments of the inventive concept may be applied to a dynamic rand access memory (DRAM) device, a static random access memory (SRAM) device, a programmable ROM (PROM) device, an erasable PROM (EPROM) device, an electrically EPROM (EEPROM) device, and/or a flash memory device.

FIG. 1 is a schematic circuit diagram illustrating a memory cell array of a semiconductor device according to embodiments of the inventive concept.

Referring to FIG. 1, a memory cell array may include a plurality of word lines WL1 to WLm, a plurality of bit lines BL1 to BLn, and a plurality of memory cells MC. The memory cells MC may be disposed at crossing points of the word lines WL1 to WLm and the bit lines BL1 to BLn, respectively.

In some embodiments, each of the memory cells MC may include a memory component Rp and a selection component D. The memory component Rp may be connected between one of the bit lines BL1 to BLn and the selection component D, and the selection component D may be disposed between the memory component Rp and one of the word lines WL1 to WLn.

In some embodiments, the memory component Rp may be a variable resistor that is configured to switch between two resistive states in response to, for example, an applied electrical pulse. According to some embodiments, the variable resistor may include a phase-change material that is configured to be changeable between an amorphous state and a crystalline state according to an amount of current (or voltage) that is applied. The phase-change material may include, for example, at least one of compounds formed by combination of two kinds of elements (e.g., GaSb, InSb, InSe, $Sb_2Te_3$, and GeTe, etc.), compounds formed by combination of three kinds of elements (e.g., GeSbTe, GaSeTe, InSbTe, $SnSb_2Te_4$, and InSbGe, etc.), and compounds formed by combination of four kinds of elements (e.g. AgInSbTe, (GeSn)SbTe, GeSb (SeTe), and $Te_{81}Ge_{15}Sb_2S_2$, etc.).

In its amorphous state, the phase-change material may have a relatively high resistance. In contrast, in its crystalline state, the phase-change material may have a relatively low resistance. A phase of the phase-change material may be changed by Joule heat generated according to the amount of current applied by, for example, an electrical pulse. The Joule heat may be generated in proportion to a resistivity of the phase-change material and an amount of time the current is applied. The phase of the phase-change material may be used to store logic data.

Meanwhile, in other embodiments, the memory component Rp may include perovskite compounds, transition metal oxides, magnetic materials, ferromagnetic materials, anti-ferromagnetic materials and/or ferroelectric materials.

As noted above, in some embodiments, the selection component D may be connected between one of the word lines WL1 to WLm and the memory component Rp. The selection component D may control the amount of current that is supplied to the memory component Rp according to a voltage of the word lines WL1 to WLm.

In some embodiments, the selection component D may be a PN junction diode or a PIN junction diode. An anode of the diode may be connected to the memory component Rp, and a cathode of the diode may be connected to one of the word lines WL1 to WLm. When a voltage difference between the anode and the cathode of the diode is greater than a threshold voltage of the diode, the diode may be turned on to supply the current to the memory component Rp.

In other embodiments, the selection component D may be a MOS transistor. For example, the selection component D may consist of a NMOS transistor and a gate of the NMOS transistor may be connected to one of the word lines WL1 to WLm. Thus, the current supply to the memory component Rp may be controlled according to the voltage of one of the word lines WL1 to WLm.

In still other embodiments, the selection component D may be a bipolar transistor BJT having a PNP or NPN structure. It will be appreciated that other selection components may also be used.

Hereinafter, a method of manufacturing a semiconductor device according to an embodiment of the inventive concept will be described in more detail with reference to FIGS. 2 to 15. FIGS. 2 to 15 are perspective views illustrating a method of manufacturing semiconductor devices according to the first embodiment of the inventive concept.

Figure 2:
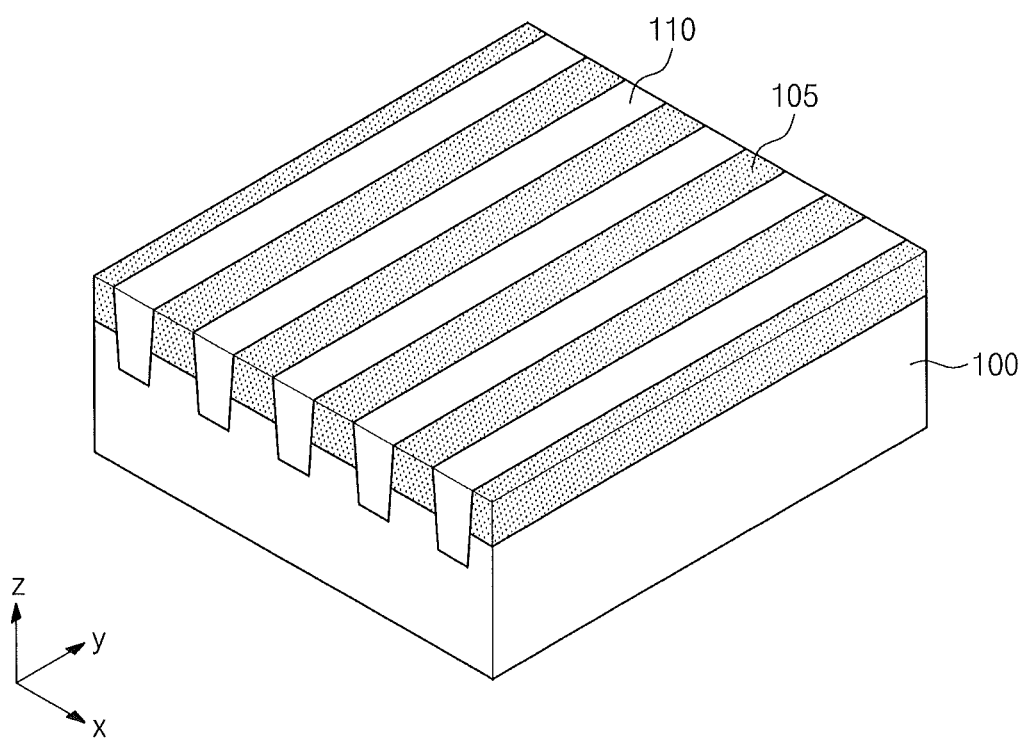
FIGS. 2 to 15 are perspective views illustrating methods of manufacturing semiconductor devices according to a first embodiment of the inventive concept.

Referring to FIG. 2, device isolation patterns 110 may be formed on or in a semiconductor substrate 100.

The semiconductor substrate 100 may be a single-crystalline semiconductor material. For example, the semiconductor substrate 100 may be a silicon-on-insulator (SOI) substrate, a germanium substrate, a germanium-on-insulator (GOI) substrate, or an epitaxial thin layer substrate formed by a selective epitaxial growth (SEG) process.

According to some embodiments, each of the device isolation patterns 110 may have a line-shape that extends in the direction of the y-axis illustrated in FIG. 2. Thus, active regions that have line-shapes may be defined in the semiconductor substrate 100 between the device isolation patterns 110.

The device isolation patterns 110 may be formed, for example, by patterning the semiconductor substrate 100 to form device isolation trenches in the substrate 100 that define the active regions, and then filling the device isolation trenches with an insulating material. The device isolation trenches may be formed by, for example, forming device isolation masks (not shown) on the semiconductor substrate 100 and then anisotropically etching the semiconductor substrate 100 using the device isolation masks as etch masks to form the device isolation trenches.

The insulating material that is deposited in the device isolation trenches to form the device isolation patterns 110 may include at least one of silicon oxide and low-k dielectrics. Herein, the term "low-k dielectrics" refers to dielectric materials that have dielectric constants that are lower than the dielectric constant of silicon oxide. Additionally, forming the device isolation patterns 110 may further include forming a liner structure (not shown) on inner surfaces of the device isolation trenches. In some embodiments, the liner structure may comprise a thermal oxide layer that is formed by thermally oxidizing the inner surfaces of the device isolation trenches and a nitride liner that is conformally formed on the thermal oxide layer. In some embodiments, the thermal oxide layer and/or the nitride liner may be omitted.

In some embodiments, before or after the device isolation patterns 110 are formed, lower interconnections 105 corresponding to the word lines WL1 to WLn of FIG. 1 may be formed in the respective active regions of the semiconductor substrate 100. Each of the lower interconnections 105 may have a line-shape that extends along the y-axis in FIG. 2. The lower interconnections 105 may be formed between the device isolation patterns 110.

In some embodiments, the lower interconnections 105 may be dopant regions which are formed by doping dopants into the semiconductor substrate 100. The lower interconnections 105 may be doped with dopants of a conductivity type that is different from a conductivity type of the semiconductor substrate 100. For example, when the semiconductor substrate 100 is doped with P-type dopants, the lower interconnections 105 may be formed by injecting a high dosage of N-type dopants into the semiconductor substrate 100. Any appropriate doping technique may be used to form the lower interconnections 105. In other embodiments, the lower interconnections 105 may comprise a metal layer that includes a metal material.

Figure 3:
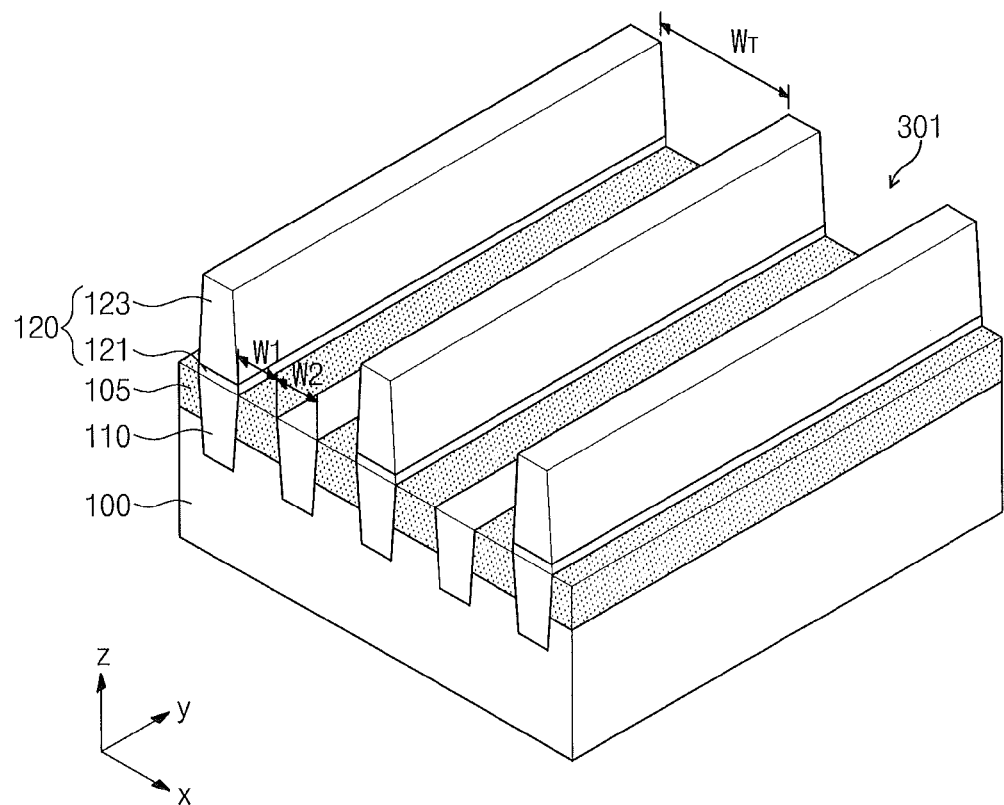

Referring to FIG. 3, mold patterns 120 that define first trenches 301 may be formed on the semiconductor substrate 100.

In some embodiments, the mold patterns 120 may be formed by sequentially forming an etch stop layer 121 and a first insulating layer 123 on the semiconductor substrate 100. Next, a first mask pattern (not shown) may be formed on the first insulating layer 123. The insulating layer 123 and the etch stop layer 121 may then be successively anisotropically etched using the first mask pattern as an etch mask until the lower interconnections 105 and the device isolation pattern 110 are exposed.

The etch stop layer 121 may be formed of, for example, oxide, nitride, and/or oxynitride. The first insulating layer 123 may be formed of, for example, a silicon oxide layer such as borosilicate glass (BSG), phosphosilicate glass (PSG), borophosphosilicate glass (BPSG), plasma enhanced tertra ethyl ortho silicate (PE-TEOS), and/or a high density plasma (HDP) oxide layer. In other embodiments, the first insulating layer 123 may be formed of at least one low-k dielectric that have dielectric constants that are lower than the dielectric constant of the silicon oxide layer. The etch stop layer 121 may be formed to have a thickness of, for example, tens of angstroms to hundreds of angstroms and the first insulating layer 123 may be formed to have a thickness of hundreds of angstroms to thousands of angstroms.

In some embodiments, a mold pattern 120 may be formed on every other device isolation pattern 110, as is shown in FIG. 3. In the discussion below, the device isolation patterns 110 that have respective mold patterns 120 formed thereon will be referred to as the "odd-numbered device isolation patterns 110." Each of the mold patterns 120 may have a line-shape that extends along the y-axis. Each of the first trenches 301 that are defined by the mold patterns 120 may expose a pair of the lower interconnections 105 (e.g., a pair of dopant regions) that are adjacent to each other. Additionally, the first trenches 301 may expose top surfaces of the device isolation patterns 110 that do not have the mold patterns 120 thereon (i.e., the "even-numbered device isolation patterns 110"). In other words, a bottom surface of each of the first trenches 301 may be defined by top surfaces of a pair of adjacent lower interconnections 105 and a top surface of the even-numbered device isolation pattern 110 that is positioned between the pair of adjacent lower interconnections 105. A width $W_T$ of the first trench 301 may be substantially equal to the sum of widths W1 of the top surfaces of the pair of the lower interconnections 105 and a width W2 of the top surface of the even-numbered device isolation pattern 110 (i.e., $W_T \approx 2W1+W2$).

Since the first trenches 301 are formed using an anisotropic etching process, a lower width of the first trench 301 may be less than an upper width of the first trench 301. Thus, the first trenches 301 may have inclined sidewalls, and an angle between a top surface of the semiconductor substrate 100 and the sidewall of the first trench 301 may be greater than 90 degrees (i.e., the inclined sidewalls of the first trenches 301 and the top surface of the semiconductor substrate 100 may define an obtuse angle).

The anisotropic etching process that is used to form the first trenches 301 may include an over etch in order to remove the etch stop layer 121 that would otherwise remain on the bottom surface of the first trenches 301. This over etch may damage the top surface of the semiconductor substrate 100 that is exposed by the first trenches 301. The surface damage to the semiconductor substrate 100 may degrade the crystal property of the semiconductor layers 130 of FIG. 5 that are formed using a selective epitaxial growth process in a subsequent processing step. Thus, in some embodiment of the present inventive concept, after the first trenches 301 are formed, a cleaning process may be performed for curing the surfaces of the semiconductor substrate 100 that are exposed by the first trenches 301. The cleaning process may be performed using a basic cleaning solution that includes, for example, ammonia, hydrogen peroxide, and water.

Figure 4:
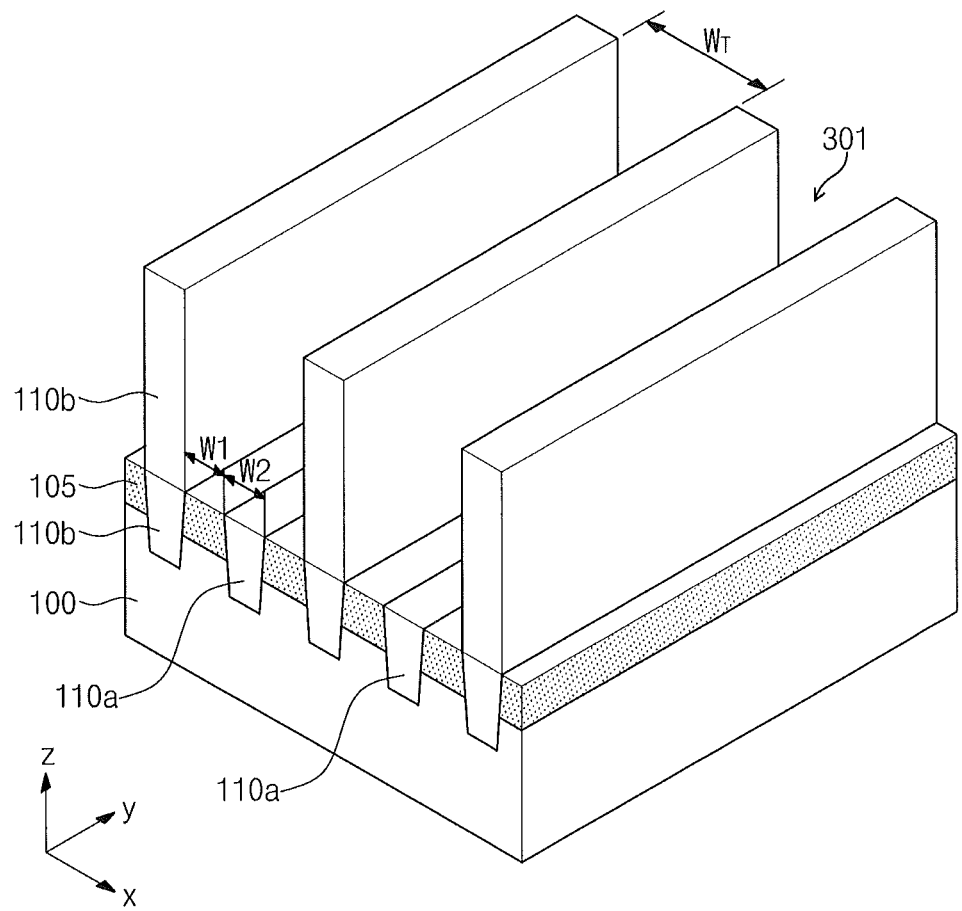

In other embodiments, instead of the mold patterns 120 consisting of the etch stop layer 121 and the first insulating layer 123, first trenches 301 may be defined by forming device isolation patterns 110b, as is illustrated in FIG. 4.

In more detail, in these embodiments, the device isolation patterns 110 may be formed to extend above the top surface of the semiconductor substrate 100. Thereafter, upper portions of the even-numbered device isolation patterns (which are labeled 110a in FIG. 4) may be removed to form the first trenches 301. Consequently, the odd-numbered device isolation patterns (which are labeled 110b in FIG. 4) may define sidewalls of the first trenches 301. As shown in FIG. 4, top surfaces of the odd-numbered device isolation patterns 110b may thus be located at a level that is higher above the semiconductor substrate 100 than is a level of the top surfaces of the even-numbered device isolation patterns 110a. As in the embodiment discussed above with respect to FIG. 3, the bottom surface of the first trench 301 may be defined by the pair of adjacent lower interconnections 105 and a top surface of the even-numbered device isolation pattern 110a that is therebetween.

Figure 5:
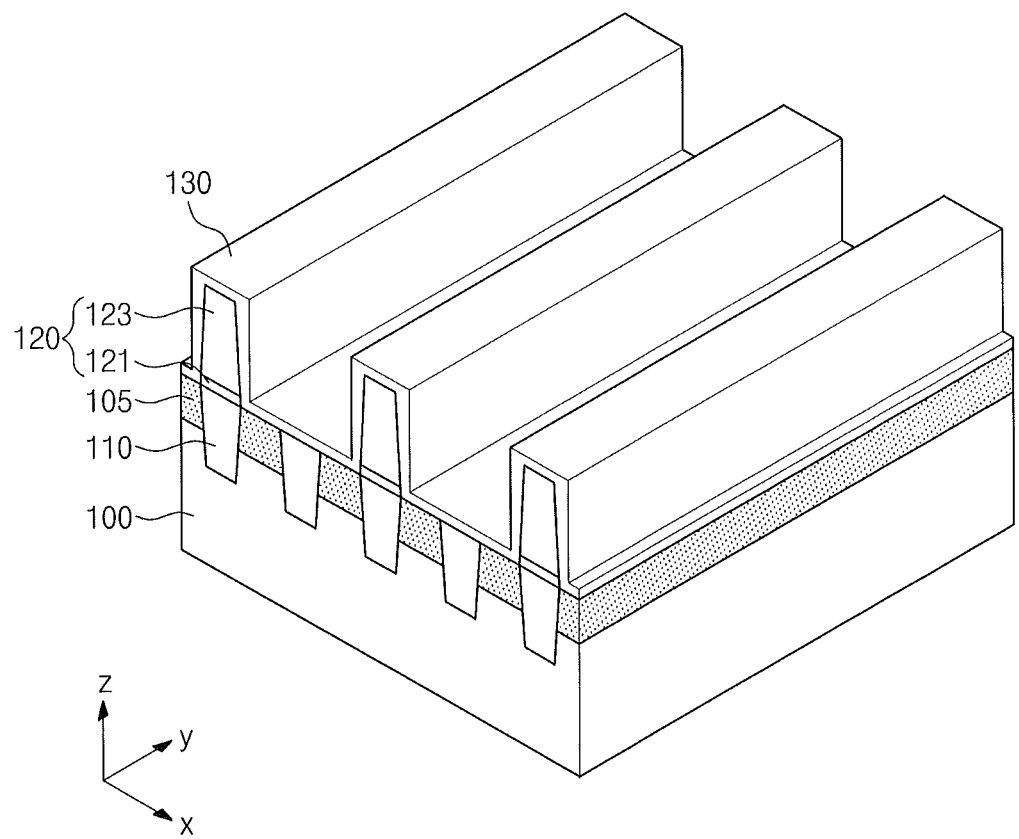

Referring to FIG. 5, a buffer insulating layer 130 may be formed to conformally cover the first trenches 301.

In some embodiments, the buffer insulating layer 130 may be deposited in the first trenches 301 by a deposition method that has a poor step-coverage property. For example, the buffer insulating layer 130 may be formed by a sputtering method or an evaporation method that have poor step-coverage. In other embodiments, the buffer insulating layer 130 may be formed by a plasma enhanced-chemical vapor deposition (PE-CVD) method that has a poor step-coverage property.

When a deposition method that has a poor step-coverage property is used, the buffer insulating layer 130 may be more thickly deposited on an upper portion of the sidewall of the trench 301 than on a lower portion of the sidewall of the trench 301. In other words, the buffer insulating layer 130 may have an over-hang on the upper portion of the first trench 301. As a result, an inner sidewall of the buffer insulating layer 130, which is formed on the inclined sidewall of the mold pattern 120, may be substantially perpendicular to the top surface of the semiconductor substrate 100.

The buffer insulating layer 130 may be formed of a material having an etch selectivity with respect to the etch stop layer 121 and the semiconductor substrate 100. For example, if the etch stop layer 121 is formed of a silicon nitride layer, the buffer insulating layer 130 may be formed of a silicon oxide layer.

Figure 6:
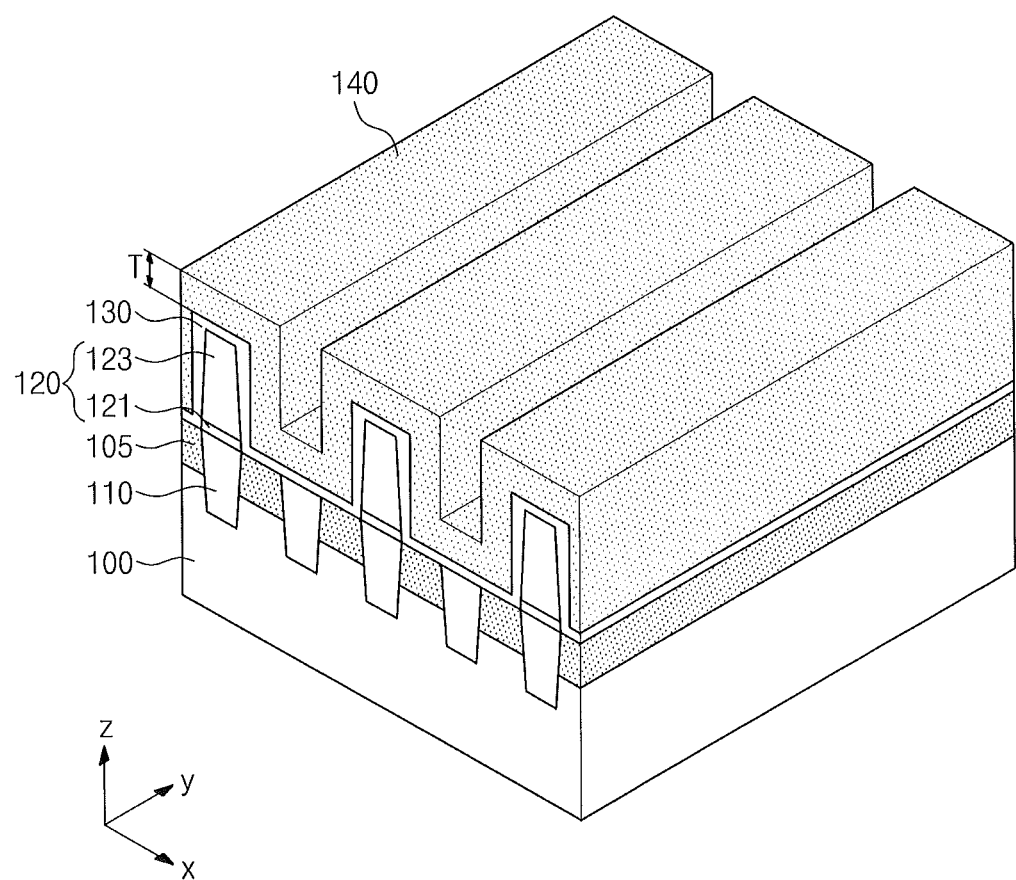

Referring to FIG. 6, a sacrificial layer 140 may be conformally formed on the buffer insulating layer 130.

The sacrificial layer 140 may be deposited by a deposition technique that has an excellent step-coverage property, such as a chemical vapor deposition (CVD) method or an atomic layer deposition (ALD) method.

A deposition thickness T of the sacrificial layer 140 may be less than a half of the width $W_T$ (see FIG. 3) of the first trench 301 (i.e. $T<\frac{1}{2} W_T$). In some embodiments, the deposition thickness T of the sacrificial layer 140 may have a range of about 0.5 times to about 1.3 times the width W1 of the lower interconnection 105. Since the deposition thickness T of the sacrificial layer 140 is less than half of the width $W_T$ of the first trench 301, the sacrificial layer 140 may conformally cover the inner sidewall of the buffer insulating layer 130 without an over-hang, a seam or a void.

The sacrificial layer 140 may be formed of a material having an etch selectivity with respect to the mold patterns 120 (e.g., the first insulating layer 123) and the buffer insulating layer 130. In other words, in a process etching the sacrificial layer 140 using a predetermined etching recipe, the sacrificial layer 140 may be formed of a material which is etched at a greater rate than the mold patterns 120 and the buffer insulating layer 130 are etched. The etch selectivity may be quantitatively represented as a ratio of an etch rate of the sacrificial layer 140 to an etch rate of the mold pattern 120 and the buffer insulating layer 130. In some embodiments, the ratio of the sacrificial layer 140 to the mold pattern 120 and buffer insulating layer 130 may be about 1:30 to about 1:200 (particularly, about 1:30 to about 1:100). For example, the mold pattern 120 and the buffer insulating layer 130 may be formed of silicon oxide and the sacrificial layer 140 may be formed of silicon nitride.

Furthermore, for improving the etch selectivity of the sacrificial layer 140 to the mold pattern 120 and the buffer insulating layer 130, the sacrificial layer 140 may be formed of silicon nitride doped with impurities (e.g. boron (B), carbon (C), and/or fluorine (F)). In other words, the sacrificial layer 140 may be formed of SiXN (where X is B, C, and/or F).

Figure 7:
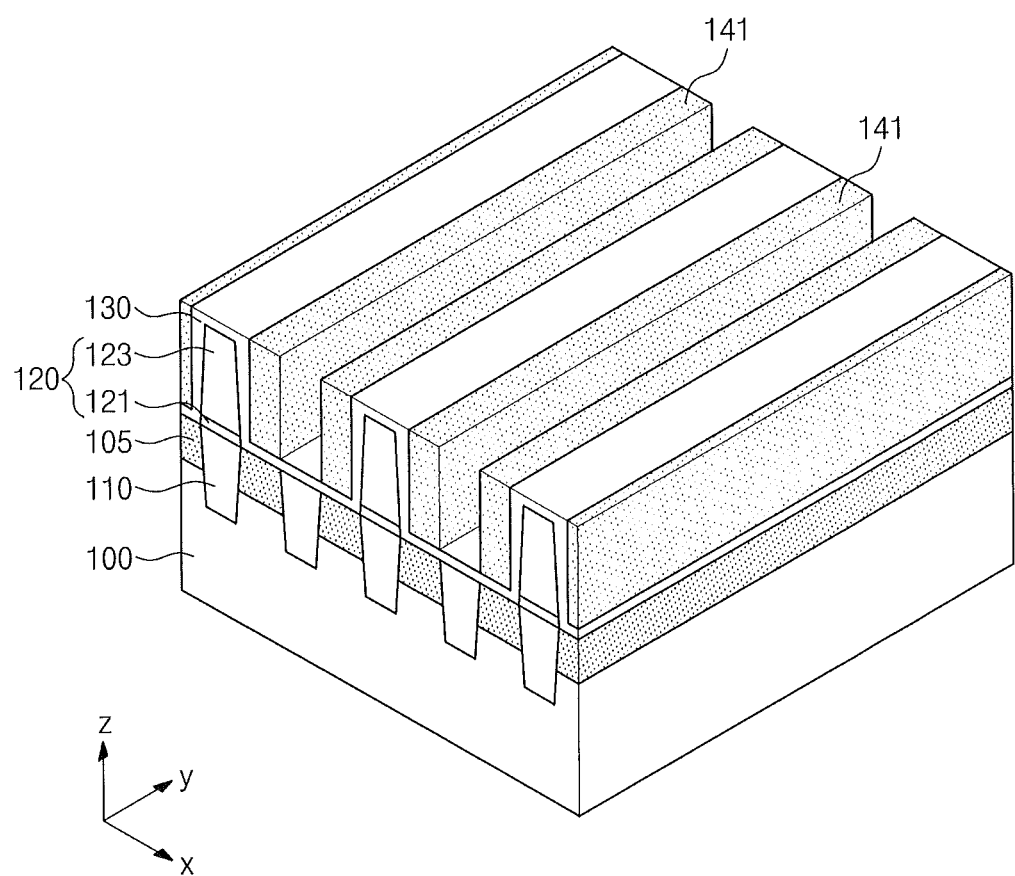

Referring to FIG. 7, a pair of sacrificial lines 141 may be formed in each of the first trenches 301. In some embodiments, the pair of sacrificial lines 141 may be formed on the pair of the lower interconnections 105 that form the outer portions of the bottom surface of each trench 301.

An entire-surface anisotropic etching process (e.g., an etch-back process) may be performed on the sacrificial layer 140 of FIG. 6, thereby forming the sacrificial lines 141. During the entire-surface anisotropic etching process for the formation of the sacrificial lines 141, the buffer insulating layer 130 may be used as an etch stop layer. In some embodiments, the buffer insulating layer 130 may be etched by the entire-surface anisotropic etching process, so that a top surface of the even-numbered device isolation pattern 110 may be exposed.

When the sacrificial lines 141 are formed directly on the inclined sidewalls of the mold patterns 120, first sidewalls of the sacrificial lines 141 may be inclined with respect to the top surface of the semiconductor substrate 100. However, as described above, when a buffer insulating layer 130 that has an over-hang is formed between the mold pattern 120 and the sacrificial line 141, a first sidewall and a second sidewall of the sacrificial lines 141 may be substantially perpendicular to the top surface of the semiconductor substrate 100. The first sidewall of the sacrificial line 141 is adjacent to the inner sidewall of the buffer insulating layer 130 and the second sidewall of the sacrificial line 141 is opposite the first sidewall of the sacrificial line 141. In other words, a width of an upper portion of the sacrificial line 141 may be substantially equal to a width of a lower portion of the sacrificial line 141.

Figure 8:
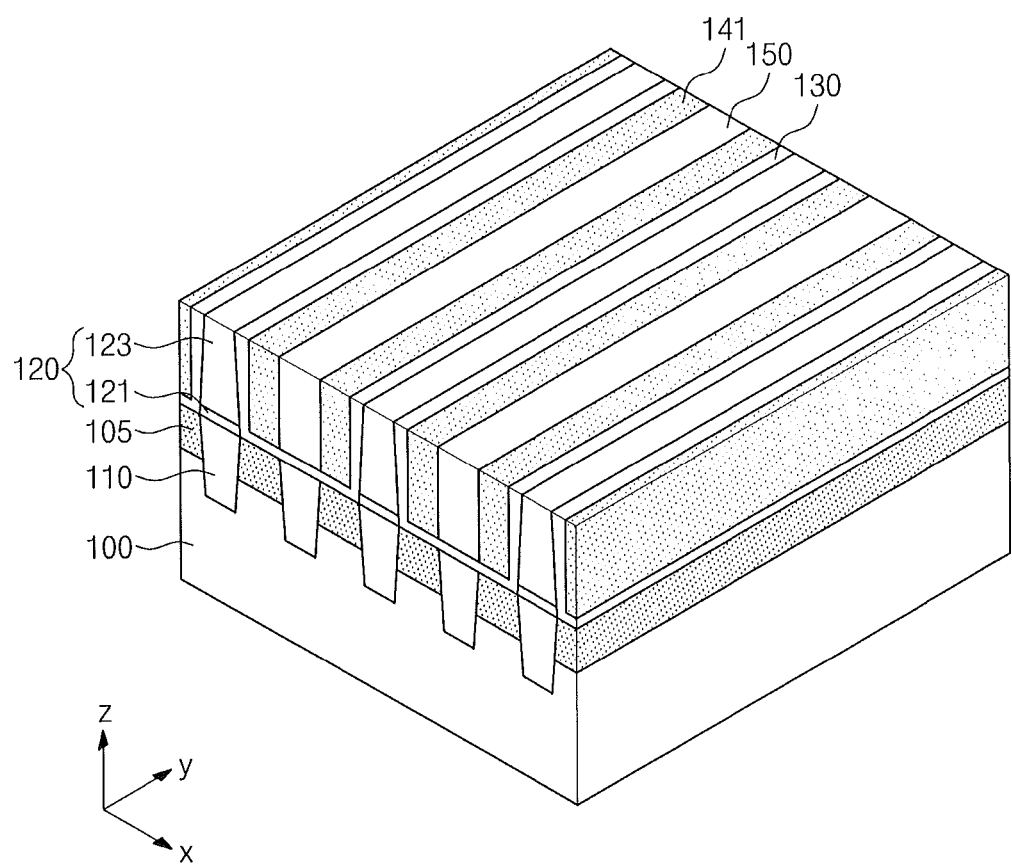

Referring to FIG. 8, a first filling layer 150 may be formed to fill the first trench 301 in which the sacrificial lines 141 are formed. The first filling layer 150 may fill a space between the pair of sacrificial lines 141 in each of the trenches 301. The first filling layer 150 may be formed of an insulating material having an etch selectivity with respect to the sacrificial lines 141. For example, the first filling layer 150 may include at least one of a silicon oxide layer and low-k dielectric layers.

The filling layer 150 may be formed by forming an insulating layer that fills the first trenches 301 and then planarizing this insulating layer until top surfaces of the sacrificial lines 141 are exposed. When the insulating layer is planarized, the buffer insulating layer 130 on top surfaces of the mold patterns 120 may be removed and upper portions of the sacrificial lines 141 may be planarized. After the first filling layer 150 is formed, the first trench 301 may be filled with the pair of the sacrificial lines 141 and the first filling layer 150 that is between the pair of sacrificial lines 141.

Figure 9:
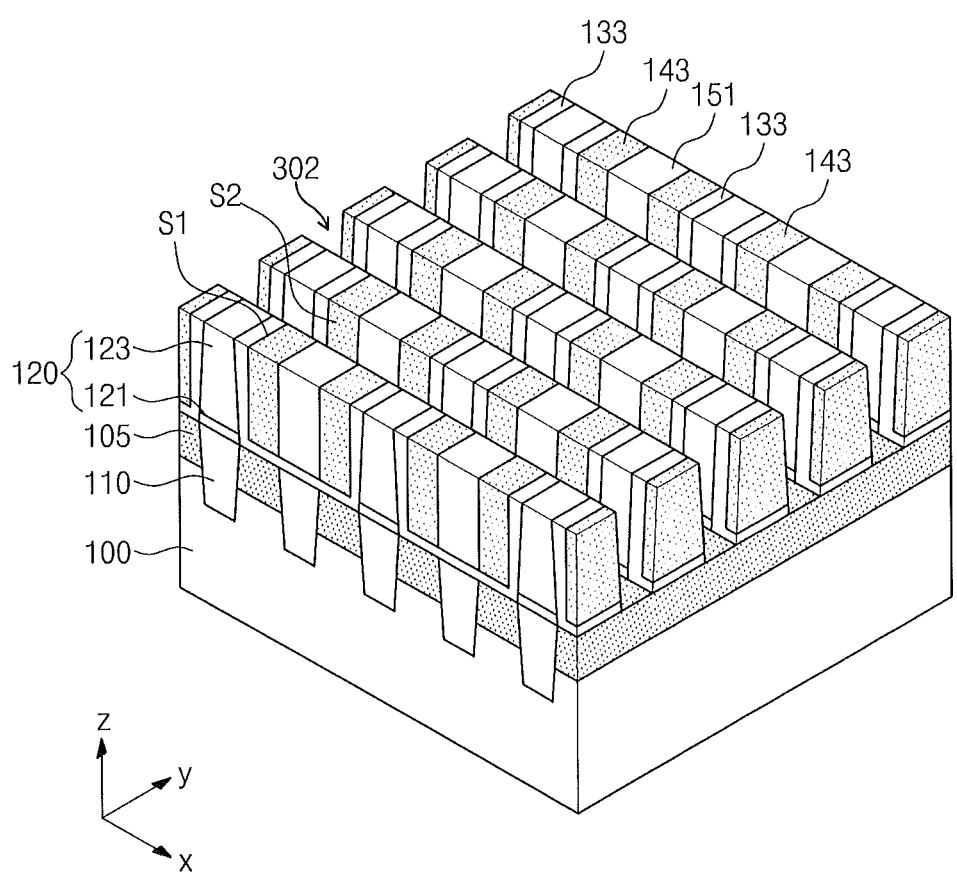

Referring to FIG. 9, second trenches 302 may be formed that cross the mold patterns 120, the sacrificial lines 141, and the first filling layers 150. In an embodiment, the second trenches 302 may extend along the x-axis illustrated in FIG. 9 so as to be substantially perpendicular to the first trenches 301.

In more detail, a second mask pattern (not shown) that has a line-and-space shape may be formed to cross the mold patterns 120, the sacrificial lines 141, and the first filling layers 150. Next, the mold patterns 120, the sacrificial lines 141, and the first filling layers 150 may be anisotropically etched using the second mask pattern as an etch mask, thereby forming the second trenches 302.

In some embodiments, the second trenches 302 may expose portions of the lower interconnections 105. Additionally, due to the anisotropic etching process, a width of a lower portion of each second trench 302 may be less than a width of an upper portion of each second trench 302. In other words, sidewalls of the sacrificial lines 141 that are exposed by the second trenches 302 may be inclined with respect to the top surface of the semiconductor substrate 100.

Figure 10:
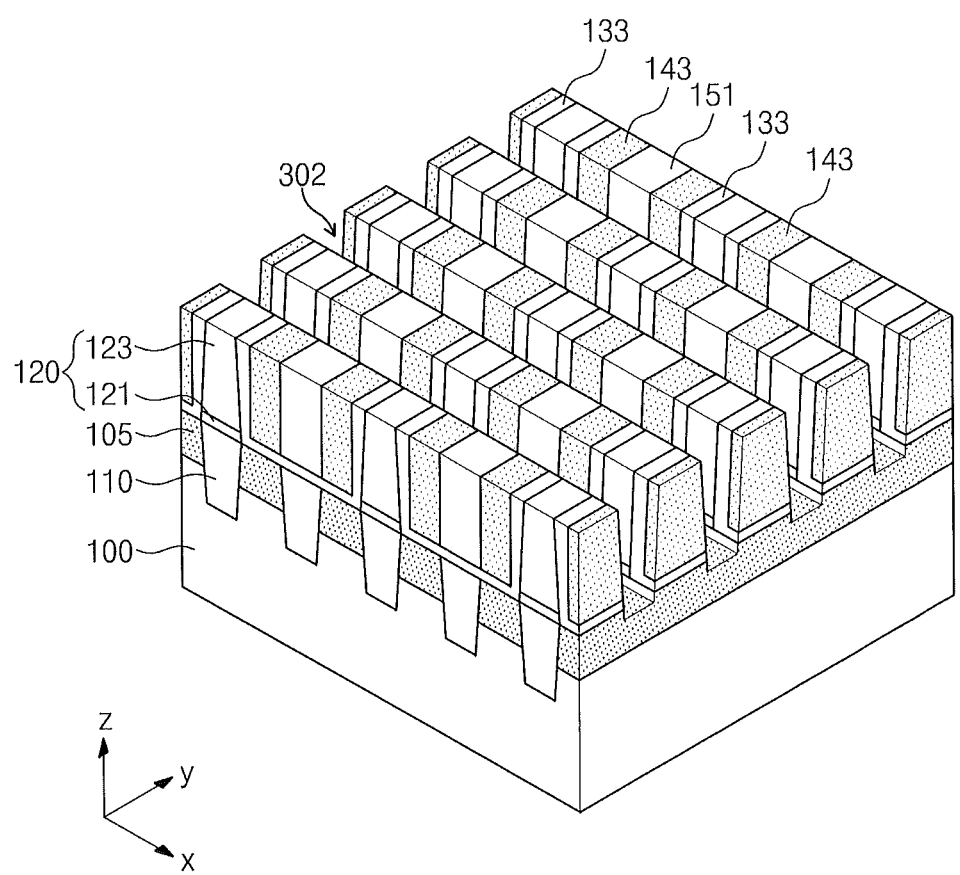

As illustrated in FIG. 10, portions of top surfaces of the lower interconnection 105 may be recessed by an over etch during the anisotropic etching process that is used to form the second trenches 302. In other words, bottom surfaces of the second trenches 302 may be recessed so that they are lower than the uppermost top surfaces of the lower interconnections 105.

The second trenches 302 may be formed, so that the sacrificial lines 141 may be divided into sacrificial patterns 143 as illustrated in FIG. 9. The sacrificial patterns 143 may be two-dimensionally arranged on the semiconductor substrate 100. Additionally, first filling patterns 151 and mold patterns 120 may be alternately disposed between the sacrificial patterns 143 along the x-axis. In other words, a plurality of spaces may be defined between the sacrificial patterns 143 arranged in the x-axis, respectively. The spaces and the sacrificial patterns 143 may be alternately arranged along the x-axis. The first filling patterns 151 and the mold patterns 120 may be disposed in the spaces, respectively. The first filling pattern 151 and the mold patterns 120 may be alternately disposed in the spaces. That is, the sacrificial pattern 143 may be disposed between the first filling pattern 151 and the mold pattern 120 adjacent each other along the x-axis.

Referring again to FIG. 9, the sacrificial pattern 143 may have a first sidewall S1 that is in contact with the buffer insulating pattern 133 and a second sidewall S2 that is exposed by the second trench 302. The first sidewall S1 of the sacrificial pattern 143 may have a first upper width and a first lower width, and the first upper width may be less than the first lower width due to the anisotropic etching process that is used to form the second trenches 302. The second sidewall S2 of the sacrificial pattern 143 may have a second upper width and a second lower width, and the second upper width may be substantially equal to the second lower width. Furthermore, each of the first and second upper widths may be less than a minimum width realized by a photolithography process. A top surface and a bottom surface of the sacrificial pattern 143 may have substantially quadrilateral-shapes. An area of the top surface of the sacrificial pattern 143 may be less than an area of the bottom surface of the sacrificial pattern 143.

Figure 11:
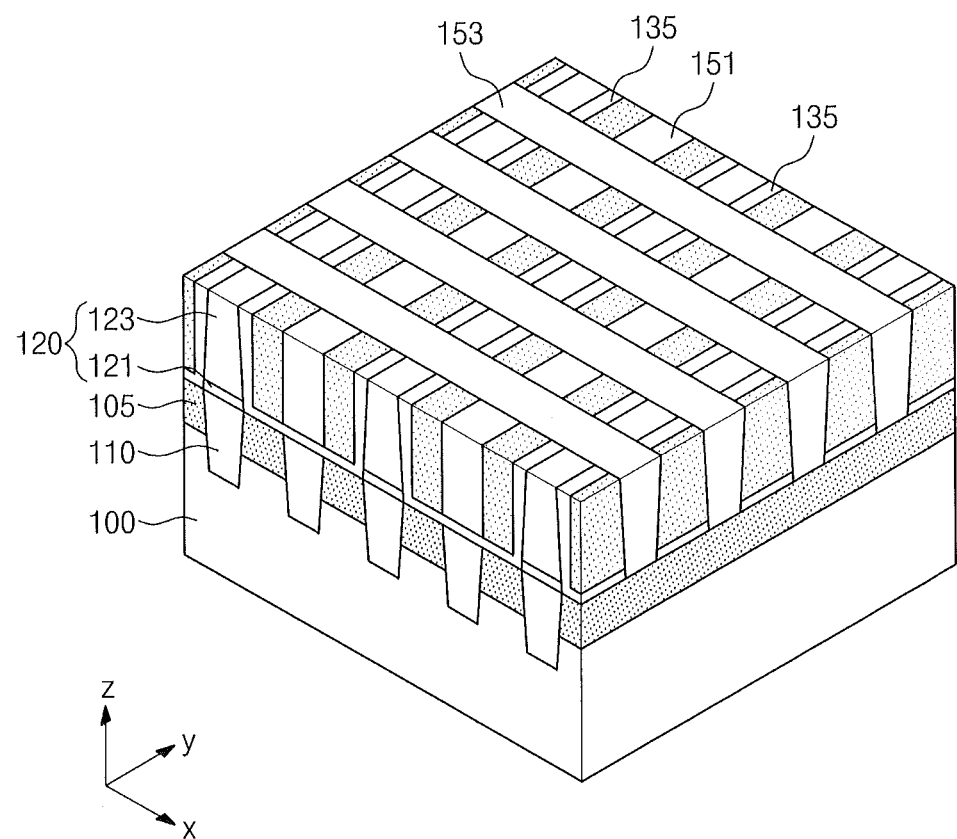

Referring to FIG. 11, next, second filling patterns 153 may be formed that fill each of the second trenches 302. The second filling patterns 153 may extend along the x-axis. The second filling patterns 153 may cover the second sidewalls of the sacrificial patterns 143. The second filling patterns 153 may be formed by forming an insulating material that fills the second trenches 302 and then planarizing the insulating material until top surfaces of the first filling patterns 151 and sacrificial patterns 143 are exposed. The second filling patterns 153 may be formed of an insulating material that has an etch selectivity with respect to the sacrificial patterns 143. For example, the second filling patterns 153 may include at least one of silicon oxide and low-k dielectrics having dielectric constants lower than that of silicon oxide.

Figure 12:
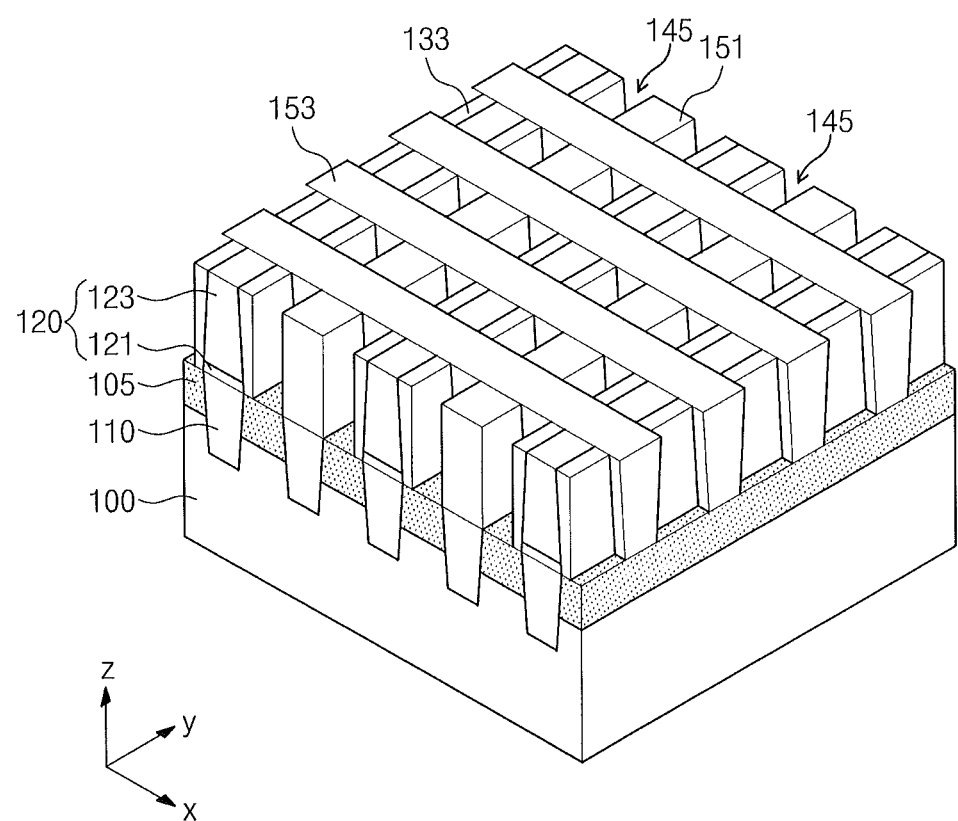

Referring to FIG. 12, the sacrificial patterns 143 may be selectively removed to form openings 145 that expose the semiconductor substrate 100.

The sacrificial patterns 143 are removed to form a mold in which the openings 145 that have fine widths are defined. The mold includes the mold patterns 120, the first filling patterns 151 and the second filling patterns 153.

In more detail, the sacrificial patterns 143 may be isotropically etched using an etch recipe having an etch selectivity with respect to the mold patterns 120, the first filling patterns 151, and the second filling patterns 153, thereby forming the openings 145. The sacrificial patterns 143 may be completely removed by the isotropic etching process. For example, if the sacrificial patterns 143 are formed of silicon nitride and the mold patterns 120, the first filling patterns 151, and the second filling patterns 153 are formed of silicon oxide, the isotropic etching process may be performed using an etching solution that includes phosphoric acid. In some embodiments, even though the mold pattern 120 includes the etch stop layer 121 formed of silicon nitride, the etch stop layer 121 is not exposed to the isotropic etching process due to the buffer insulating pattern 133 and the second filling pattern 153.

After the sacrificial patterns 143 are removed, portions of the buffer insulating pattern 133 under the sacrificial patterns 143 may be removed by an additional process. Thus, the top surfaces of the lower interconnections 105 may be locally exposed by the openings 145.

Figure 13:
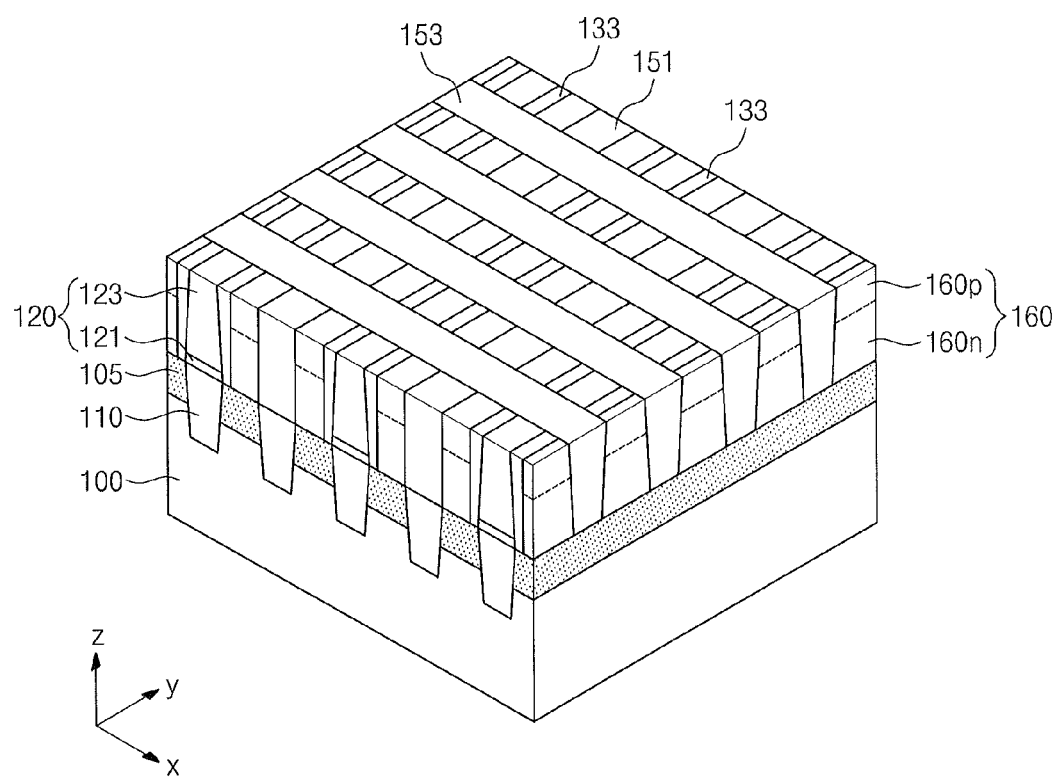

Referring to FIG. 13, semiconductor patterns 160 may be grown from the semiconductor substrate 100 within the respective openings 145.

In some embodiments, the semiconductor patterns 160 may be formed by a selective epitaxial growth (SEG) method using the lower interconnections 105, which are exposed by the mold, as seeds. The semiconductor patterns 160 formed by the SEG method may have a single crystalline structure. The semiconductor patterns 160 may include, for example, silicon (Si), germanium (Ge), or any combination thereof.

In other embodiments, the semiconductor patterns 160 may be formed using a solid phase epitaxial (SPE) method. For example, an amorphous semiconductor layer or a poly-crystalline semiconductor layer may be deposited in the openings 145 and then the amorphous or poly-crystalline semiconductor layer may be crystallized to form the semiconductor patterns 160.

In still other embodiments, the semiconductor patterns 160 may be formed using a laser-induced epitaxial growth (LEG) process. For example, after an amorphous semiconductor layer is formed in the openings 145, a laser beam such as an excimer laser may be used to irradiate the amorphous semiconductor layer. The amorphous semiconductor layer may be crystallized by the irradiation of the laser beam, so that the semiconductor patterns 160 may be formed.

In some embodiments, the semiconductor patterns 160 that are grown from the lower interconnections 105 may be grown over a top surface of the mold. Thus, after the SEG process is performed, a planarization process may be performed to planarize top surfaces of the semiconductor patterns 160.

The semiconductor patterns 160 may have first sidewalls that are in contact with the buffer insulating patterns 133 and second sidewalls that are in contact with the second filling patterns 153. Since the semiconductor patterns 160 are formed in the openings 145 that have fine widths, the semiconductor patterns 160 may have fine widths.

Subsequently, an upper dopant region 160$p$ and a lower dopant region 160$n$ are formed in each of the semiconductor patterns 160.

In more detail, the lower dopant region 160$n$ may have a conductivity type that is different from that of the upper dopant region 160$p$. For example, the upper dopant region 160$p$ may be formed by implanting P-type dopant ions into the semiconductor pattern 160, and the lower dopant region 160$n$ may be formed by implanting N-type dopant ions into the semiconductor pattern 160. The lower dopant region 160$n$ may be in contact with the upper dopant region 160$p$. In some embodiments, a doping concentration of the P-type dopants of the upper dopant region 160$p$ may be greater than a doping concentration of the N-type dopants of the lower dopant region 160$n$. In other embodiments, N-type dopants and P-type dopants may be sequentially doped in-situ during the SEG (or other growth) process, thereby forming the lower dopant region 160n and the upper dopant region 160p.

The lower and upper dopant regions 160n and 160p may be formed so that a PN junction or a PIN junction may be formed in each of the semiconductor patterns 160. The PN junction or the PIN junction may act as a rectifying element.

Figure 14:
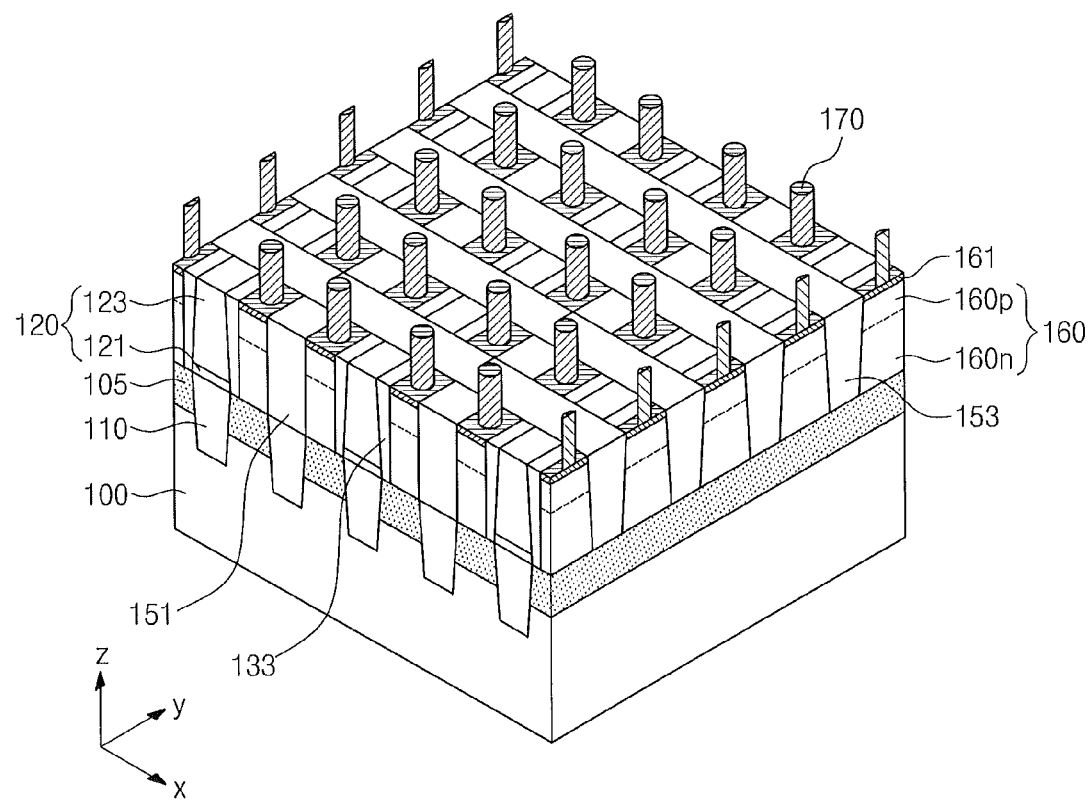

Referring to FIG. 14, lower electrodes 170 may be formed on the respective semiconductor patterns 160.

In some embodiments, the lower electrodes 170 may be formed by forming a first interlayer insulating layer (not shown) on the semiconductor patterns 160. Openings (not shown), which expose top surfaces of the semiconductor patterns 160, respectively, may be formed in the first interlayer insulating layer. And then the lower electrodes 170 may be formed in the openings, respectively.

In some embodiments, the lower electrodes 170 may be formed in the openings which are locally formed in the first interlayer insulating layer (not shown). Spacers may be formed on inner sidewalls of the openings, respectively, for reducing areas of top surfaces of the lower electrodes 170.

The lower electrodes 170 may include at least one of nitrides including metal elements, oxynitrides including metal elements, carbon (C), titanium (Ti), tantalum (Ta), aluminum-titanium (TiAl), zirconium (Zr), hafnium (Hf), molybdenum (Mo), aluminum (Al), aluminum-copper (Al—Cu), aluminum-copper-silicon (Al—Cu—Si), copper (Cu), tungsten (W), tungsten-titanium (TiW), and tungsten silicide (WSix). The nitrides including metal elements may include, for example, TiN, TaN, WN, MoN, NbN, TiSiN, TiAlN, TiBN, ZrSiN, WSiN, WBN, ZrAlN, MoSiN, MoAlN, TaSiN, and/or TaAlN. The oxynitrides including metal elements may include TiON, TiAlON, WON, and/or TaON.

In some embodiments, before the lower electrodes 170 are formed, an ohmic layer 161 may be formed on each of the semiconductor patterns 160. The ohmic layer may provide an ohmic contact between the semiconductor patterns 160 and their respective lower electrodes 170.

The top surface of the semiconductor patterns 160 may react with a metal material to form the ohmic layer 161. The ohmic layer 161 may comprise at least one metal silicide such as, for example, cobalt silicide, titanium silicide, nickel silicide, and/or tungsten silicide.

Figure 15:
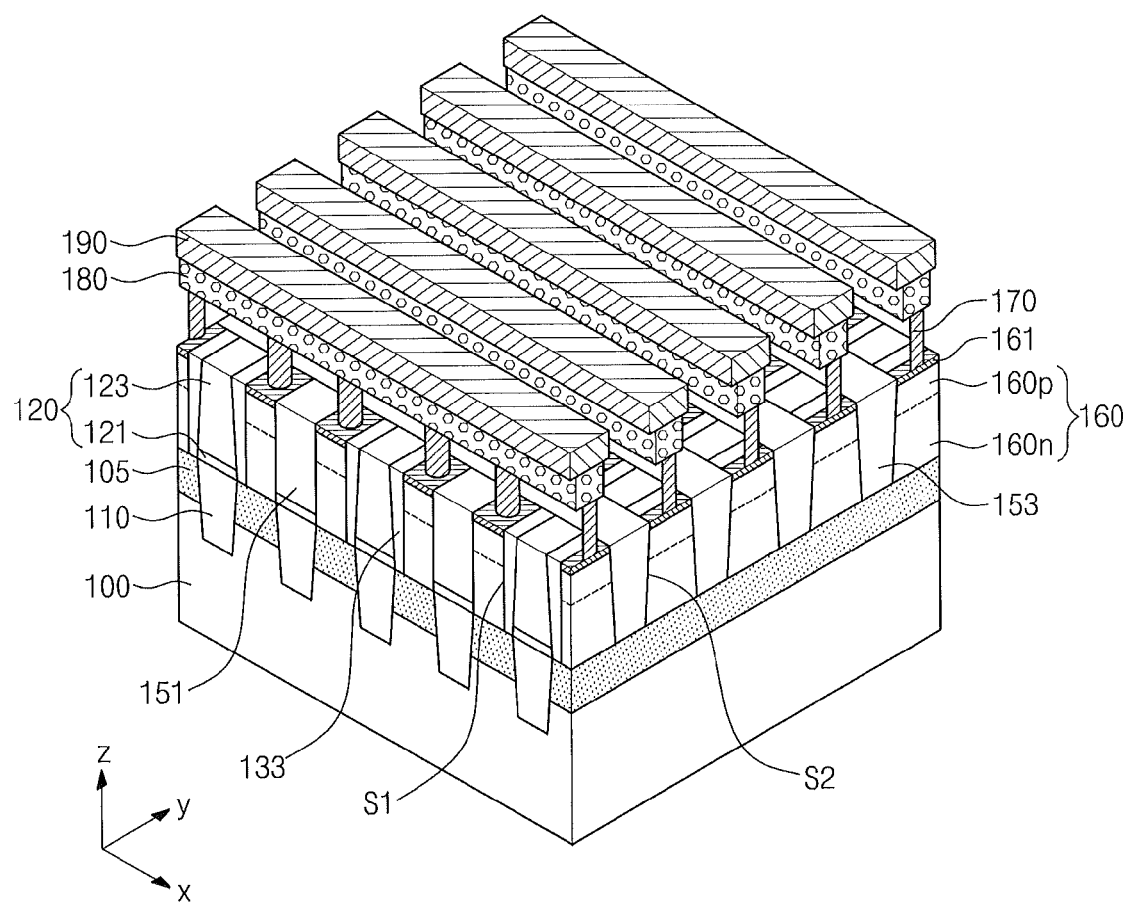

Referring to FIG. 15, memory components 180 and upper interconnections 190 may be formed on the lower electrodes 170.

In more detail, a second interlayer insulating layer (not shown) may be formed on the first insulating layer in which the lower electrodes 170 are formed. The memory components 180 may be formed in the second interlayer insulating layer. Each of the memory components 180 may have a line-shape crossing the lower interconnections 105. Alternatively, the memory components 180 may be parallel to the lower interconnections 105. In still other embodiments, each of the memory components 180 may have an island-shape corresponding to each of the semiconductor patterns 160, so that the memory components 180 may be two-dimensionally arranged on the semiconductor substrate 100.

In some embodiments, the memory components 180 may include at least one material that has a variable resistance property. The resistances of the material(s) having the variable resistance property may be changed by passing a current through the materials. For example, the memory components 180 may include at least one of phase-change materials (e.g. chalcogenides) of which electrical resistances are changed by heat generated by the current passing through the phase-change materials. The chalcogenides may include at least one of, for example, antimony (Sb), tellurium (Te), and selenium (Se).

For example, the phase-change material may be formed of one of Ge—Sb—Te, As—Sb—Te, As—Ge—Sb—Te, Sn—Sb—Te, Ag—In—Sb—Te, In—Sb—Te, a group 5A element-Sb—Te, a group 6A element-Sb—Te, a group 5A element-Sb—Se, a group 6A element-Sb—Se, Ge—Sb, In—Sb, Ga—Sb, and a doped Ge—Sb—Te. The doped Ge—Sb—Te may be doped with at least one of C, N, B, Bi, Si, P, Al, Dy, and Ti. The phase-change material may be formed by a physical vapor deposition (PVD) method or a chemical vapor deposition (CVD) method. If the memory components 180 are formed of the phase-change material as described above, a capping electrode layer (not shown) may be formed on a phase-change material layer before a patterning process for the formation of the memory components 180 is performed.

In other embodiments, the memory component 180 may have a thin layer structure of which an electrical resistance is changed using a spin torque transfer method caused by the current passing through the memory component 180. For example, the memory component 180 may have the thin layer structure having a magneto-resistance property. The thin layer structure having the magneto-resistance property may include at least one ferromagnetic material and/or at least one antiferromagnetic material. In still other embodiments, the memory component 180 may include at least one of perovskite compounds or transition metal oxides.

The upper interconnections 190 may be formed on the memory components 180 and may cross over the lower interconnections 105 along the x-axis. In some embodiments, the upper interconnections 190 may be substantially parallel to the memory components 180.

The upper interconnections 190 may include at least one of nitrides including metal elements, oxynitrides including metal elements, carbon (C), titanium (Ti), tantalum (Ta), aluminum-titanium (TiAl), zirconium (Zr), hafnium (Hf), molybdenum (Mo), aluminum (Al), aluminum-copper (Al—Cu), aluminum-copper-silicon (Al—Cu—Si), copper (Cu), tungsten (W), tungsten-titanium (TiW), and tungsten silicide (WSix). Here, the nitrides including metal elements may include TiN, TaN, WN, MoN, NbN, TiSiN, TiAlN, TiBN, ZrSiN, WSiN, WBN, ZrAlN, MoSiN, MoAlN, TaSiN, and/or TaAlN. The oxynitrides including metal elements may include TiON, TiAlON, WON, and/or TaON.

Figure 16:
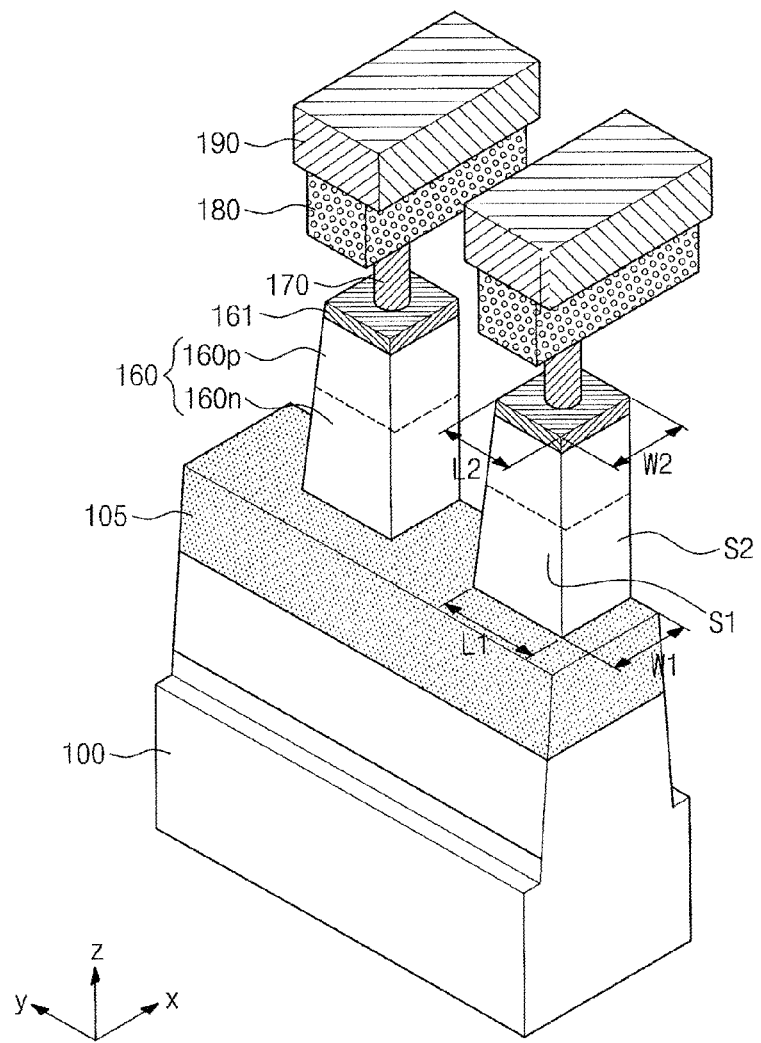
FIG. 16 is a partial perspective view illustrating a semiconductor device according to a first embodiment of the inventive concept.

The semiconductor device manufactured by the manufacturing method according to a first embodiment of the inventive concept will be described with reference to FIGS. 15 and 16. FIG. 16 is a partial perspective view illustrating a semiconductor device according to a first embodiment of the inventive concept.

Referring to FIGS. 15 and 16, the semiconductor device according to the first embodiment may include the semiconductor substrate 100, the lower interconnections 105 on the semiconductor substrate 100, the upper interconnections 190 crossing over the lower interconnections 105, selection components respectively disposed at crossing regions of the lower interconnections 105 and the upper interconnections 190, and memory components 180 between the selection components and the upper interconnections 190. The selection components may be two-dimensionally arranged on the semiconductor substrate 100, and the selection components may control the current passing through the memory components 180.

In more detail, each of the lower interconnections 105 may have a line-shape extending along the y-axis on the semiconductor substrate 100. In some embodiments, the lower interconnections 105 may be dopant regions formed by doping dopants in high concentration into the semiconductor substrate 100. The lower interconnections 105 may have a conductivity type different from that of the semiconductor substrate 100.

The selection components include the semiconductor patterns 160 formed by the manufacturing method according to the first embodiment as described above. Each of the semiconductor patterns 160 may include the upper and lower dopant regions 160p and 160n. The upper and lower dopant regions 160p and 160n may have conductivity types different from each other, respectively. For example, the lower dopant region 160n may have the same conductivity type as the lower interconnection 105, and the upper dopant region 160p may have a conductivity type different from the lower dopant region 160n. Thus, a PN junction may be formed in each of the semiconductor patterns 160. Alternatively, an intrinsic region may be disposed between the upper dopant region 160p and the lower dopant region 160n, so that a PIN junction may be formed in each of the semiconductor patterns 160.

In other embodiments, a bipolar transistor of a PNP or NPN structure may be formed by the semiconductor substrate 100, the lower interconnection 105, and the semiconductor pattern 160.

According to the manufacturing method described above, the semiconductor patterns 160 for the selection components may be two-dimensionally arranged on the semiconductor substrate 100.

In more detail, the semiconductor pattern 160 may include the first sidewall S1 that is adjacent the buffer insulating pattern 133 and the second sidewall S2 that is adjacent the second filling pattern 153. As illustrated in FIG. 16, the first sidewall S1 of the semiconductor pattern 160 may have a first upper width L2 and a first lower width L1. The first upper width L2 may be less than the first lower width L1 due to the above-described anisotropic etching process. The second sidewall S2 of the semiconductor pattern 160 may have a second upper width W2 and a second lower width W1. The second upper width W2 may be substantially equal to the second lower width W1. The first and second upper widths L2 and W2 may be less than a minimum width realized by a photolithography process. The upper surface and the bottom surface of the semiconductor pattern 160, which may be parallel to the bottom surface of the semiconductor substrate 100, may have substantially quadrilateral-shapes. The area of the upper surface of the semiconductor pattern 160 may be less than the area of the bottom surface of the semiconductor pattern 160.

Additionally, referring to FIG. 15, the first filling patterns 151 and the mold patterns 120 may be alternately disposed between the semiconductor patterns 160 that are arranged along the x-axis. The buffer insulating pattern 133 may be disposed between the semiconductor pattern 160 and the mold pattern 120. The buffer insulating pattern 133 may have a lower width and an upper width that is greater than the lower width along the x-axis.

The second filling patterns 153 may be disposed between the semiconductor patterns 160 arranged in the y-axis. Additionally, the second filling patterns 153 may also be disposed between the mold patterns 120 arranged in the y-axis. Thus, the semiconductor patterns 160 may be surrounded by insulating material. Top surfaces of the semiconductor patterns 160 may be substantially coplanar with top surfaces of the mold patterns 120 and top surfaces of the first and second filling patterns 151 and 153.

The lower electrodes 170, the memory components 180, and the upper interconnections 190 may be disposed on the semiconductor patterns 160.

In some embodiments, each of the memory components 180 may be parallel to the upper interconnections 190 and may be connected to respective ones of the plurality of lower electrodes 170 that are arranged in a longitudinal direction of the memory component 180. Alternatively, the memory components 180 may have island-shapes and be two-dimensionally arranged. That is, the memory components 180 may be disposed on the respective semiconductor patterns 160. In some embodiments, each memory component 180 may be a variable resistor that is configured to switch between two resistive states by an applied electrical pulse as described above. In some embodiments, the memory component 180 may include a phase-change material which has a crystal state that changes depending upon an amount of current supplied to the phase change material. In other embodiments, the memory component 180 may include perovskite compounds, transition metal oxides, magnetic materials, ferromagnetic materials, anti-ferromagnetic materials and/or ferroelectric materials.

Each of the lower electrodes 170 may be disposed between a respective one of the semiconductor patterns 160 and a respective one of the memory components 180. A horizontal area of the lower electrode 170 (i.e., a cross-sectional area taken in a plane parallel to the bottom surface of the substrate 100) may be smaller than a horizontal area of the semiconductor pattern 160 or a horizontal area of the memory component 180.

In some embodiments, each of the lower electrodes 170 may have a pillar-shape. In other embodiments, a shape of the lower electrode 170 may be variously changed for reducing a contact area between the lower electrode 170 and the memory component 180. For example, the lower electrode 170 may have a space structure such as a U-shape, L-shape, a hollow type cylinder structure, a ring structure, or a cup structure.

The ohmic layer 161 may be disposed between each of the lower electrodes 170 and each of the semiconductor patterns 160 for reducing a contact resistance. For example, the ohmic layer 161 may include a metal silicide such as titanium silicide, cobalt silicide, tantalum silicide, and/or tungsten silicide.

The upper interconnections 190 may cross over the lower interconnections 105. The upper interconnections 190 may be disposed on and be electrically connected to the memory components 180.

A method of manufacturing a semiconductor device according to a second embodiment of the inventive concept will be described with reference to FIGS. 17 to 20. FIGS. 17 to 20 are perspective views illustrating the method of manufacturing the semiconductor device according to the second embodiment of the inventive concept. In the method of manufacturing the semiconductor device according to a second embodiment of the inventive concept, the same elements as described in the first embodiment will be indicated by the same reference numerals or the same reference designators. For the ease and convenience in explanation, descriptions of the elements that are in the second embodiment that are also in the first embodiment will be omitted or only mentioned briefly.

Figure 17:
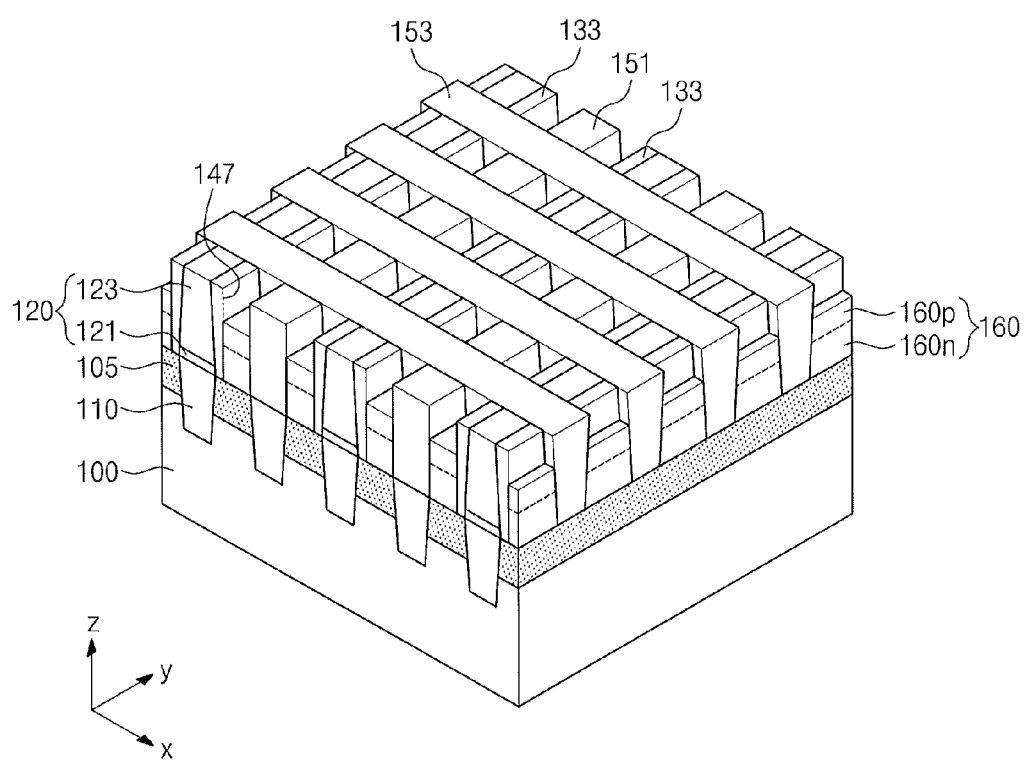
FIGS. 17 to 20 are perspective views illustrating methods of manufacturing semiconductor devices according to a second embodiment of the inventive concept.

According to the second embodiment, the semiconductor patterns 160 may be formed to be two-dimensionally arranged on the semiconductor substrate 100 as described with reference to FIGS. 3 to 13. Subsequently, as illustrated in FIG. 17, the top surfaces of the semiconductor patterns 160 may be etched by a predetermined depth, thereby forming recess regions 147.

Each of the recess regions 147 may include one pair of inner sidewalls defined by adjacent second filling patterns 153, and another pair of inner sidewalls defined by the first filling pattern 151 and the buffer insulating layer 133 that are adjacent each other along the x-axis.

Figure 18:
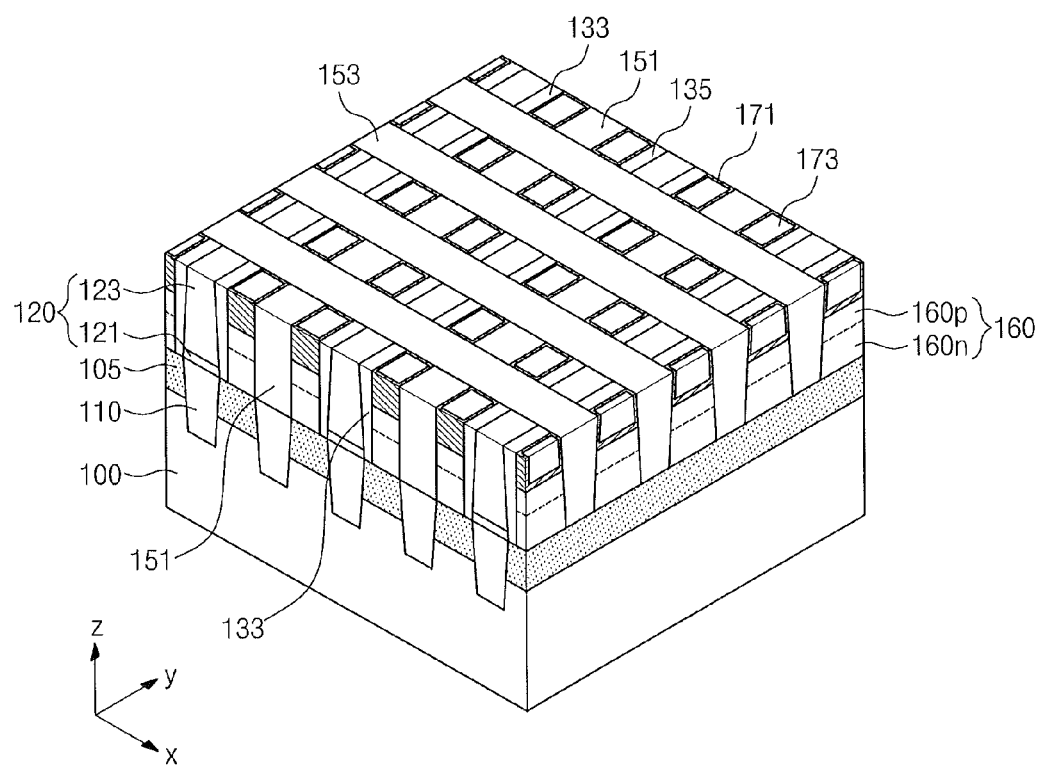
Figure 19:
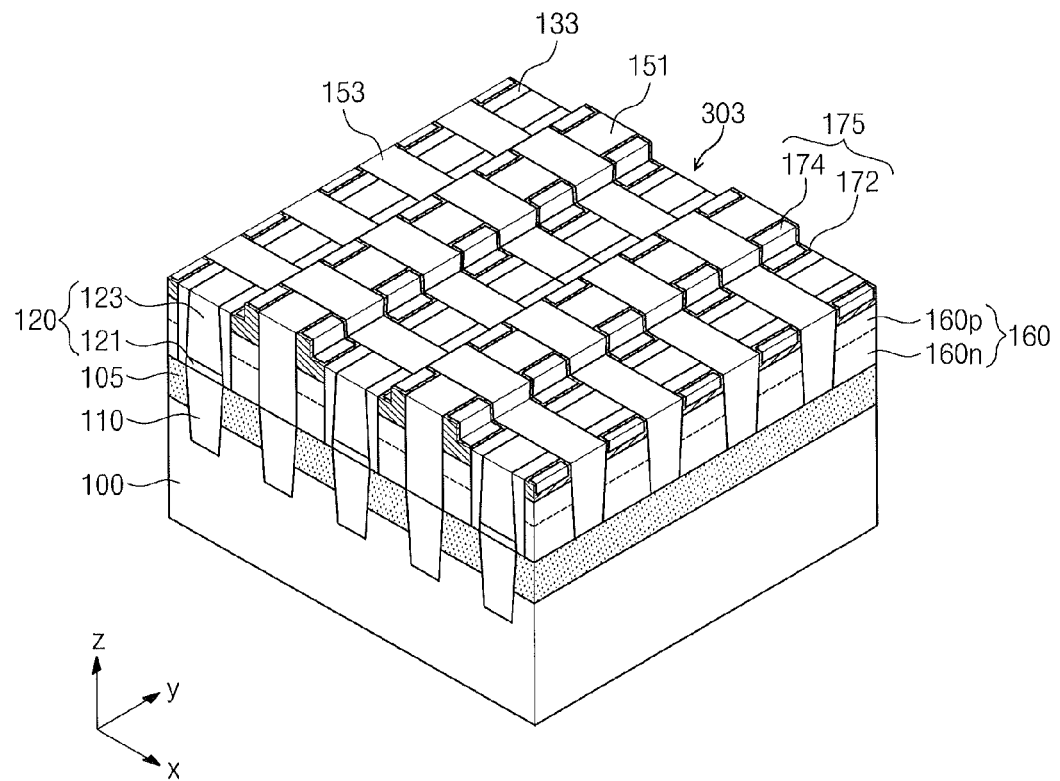

Referring to FIGS. 18 and 19, lower electrodes may be formed in the recess regions 147, respectively. A top surface of each lower electrode may be narrower than a bottom surface thereof. In some embodiments, the lower electrodes may be formed by forming a lower electrode layer 171 that conformally covers the inner sidewalls of the recess regions 147. Then, the lower electrode layer 171 may be planarized until top surfaces of the second filling patterns 153 are exposed, thereby forming the lower electrodes.

In some embodiments, after the lower electrode layer 171 is conformally deposited in the recess regions 147, a capping insulating layer 173 that fills the recess regions 147 may be formed on the lower electrode layer 171. The capping insulating layer 173 and the lower electrode layer 171 may be planarized until the top surfaces of the second filling patterns 153 are exposed. For example, the capping insulating layer 173 may be formed of at least one of $SiO_2$, SiN, PE-SiN, SiON, C, ALD-AlN, GeN, $Al_2O_3$, MgO, $SiO_2$, CaO, $Y_2O_3$, $TiO_2$, $Cr_2O_3$, FeO, CoO, ZrO and $CuO_2$.

Referring to FIG. 19, an upper trench 303 may be formed to recess a portion of a top surface of the planarized lower electrode layer 171. The upper trench 303 may be substantially parallel to the first trench 301.

Since the upper trench 303 is formed, lower electrode structures 175 may be formed on the semiconductor patterns 160, respectively. As illustrated in FIG. 19, the lower electrode structure 175 may include a lower electrode 172 and a capping insulating pattern 174 disposed in an inner space surrounded by the lower electrode 172. The lower electrode 172 may include a bottom portion and sidewall portions in a cross-section that is normal to a bottom surface of the semiconductor substrate 100. The sidewall portions of the lower electrode 172 may extend from edges of the bottom portion along the first filling pattern 151 and the mold pattern 120, respectively. Heights of the sidewall portions of the lower electrode 172 may be different from each other due to the upper trench 303. A maximum width of the lower electrode 172 along the x-axis may be substantially equal to the upper width of the semiconductor pattern 160.

Figure 20:
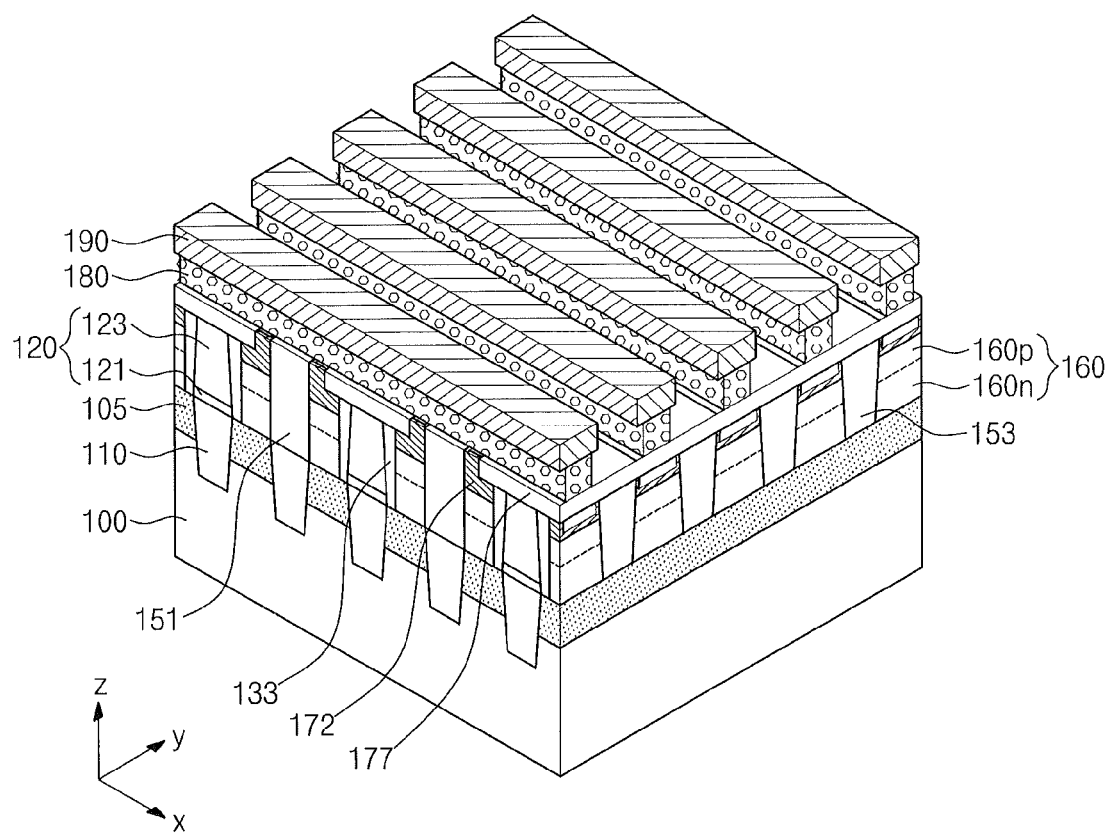

Referring to FIG. 20, a filling insulating layer 177 may be formed to fill the upper trench 303 and then the filling insulating layer 177 may be planarized until top surfaces of the lower electrodes 172 are exposed. In other embodiments, the filling insulating layer 177 may be omitted and a subsequent interlayer insulating layer (not shown) may be formed to fill the upper trench 303.

Subsequently, memory components 180 and upper interconnections 190 may be formed on the lower electrode structures 175. The memory components 180 and the upper interconnections 190 may have line-shapes that cross over the lower interconnections 105.

Figure 21:
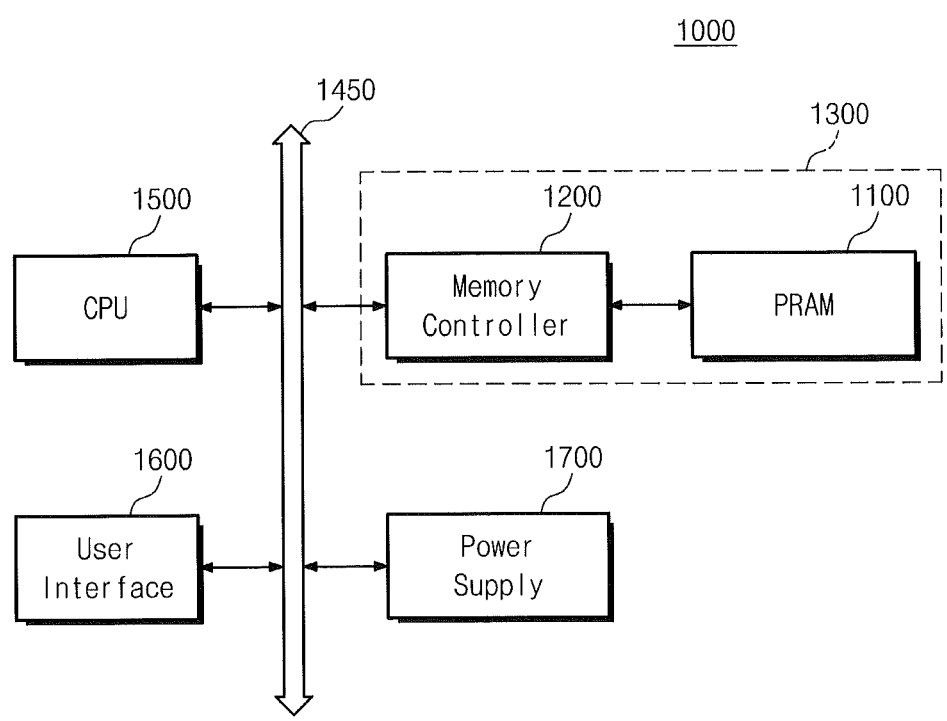
FIG. 21 is a schematic block diagram illustrating an electronic device including a semiconductor device according to embodiments of the inventive concept.

FIG. 21 is a schematic block diagram illustrating an electronic device including a semiconductor device according to embodiments of the inventive concept.

An electronic device 1000 including the semiconductor device according to embodiments of inventive concept may be, for example, one of an application chipset, a camera image processor (CIS), a personal digital assistant (PDA), a laptop computer, a portable computer, a web tablet, a wireless phone, a mobile phone, a digital music player, a wireless electronic device, and a complex electronic device including any combination thereof.

Referring to FIG. 21, the electronic device 1000 may include a memory system 1300, a central processing unit (CPU) 1500, a user interface unit 1600, and a power supply 1700. The memory system 1300 may include the semiconductor memory device 1100 (e.g., a PRAM) according to embodiments of the inventive concept and a memory controller 1200. The memory system 1300, the CPU 1500, the user interface unit 1600, and the power supply 1700 may be electrically connected to a system bus 1450.

Data, which is provided through the user interface unit 1600 or processed by the CPU 1500, may be stored in the semiconductor memory device 1100 through the memory controller 1200. The semiconductor memory device 1100 may constitute a solid state disk (SSD). In this case, an operation speed of the electronic device 1000 may be very fast.

In the semiconductor devices according to embodiments of the inventive concept, a mold may be formed that includes openings having fine widths that expose the semiconductor substrate. The semiconductor patterns in which the selection components are formed may be formed in these openings in the mold. Thus, it is possible to form semiconductor patterns having fine and uniform widths. As a result, it is possible to realize semiconductor devices having both high integration and excellent reliability.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. A semiconductor device comprising:
   conductive lower interconnections;
   conductive upper interconnections crossing over the lower interconnections;
   selection components disposed at crossing points of the lower interconnections and the upper interconnections, respectively; and
   memory components disposed between the selection components and the upper interconnections,
   wherein each of the selection components includes a semiconductor pattern having a first sidewall disposed in a first direction and a second sidewall disposed in a second direction that is substantially perpendicular to the first direction;
   wherein the first sidewall of each semiconductor pattern has a first upper width and a first lower width greater than the first upper width; and
   wherein the second sidewall of each semiconductor pattern has a second upper width and a second lower width that is substantially equal to the second upper width.

2. The semiconductor device of claim 1, wherein each semiconductor pattern comprises a single-crystalline semiconductor epitaxial layer.

3. The semiconductor device of claim 1, wherein an area of a top surface of each semiconductor pattern is smaller than an area of a bottom surface of each semiconductor pattern.

4. The semiconductor device of claim 1, wherein the first sidewall of each semiconductor pattern is substantially perpendicular to a top surface of a respective one of the lower interconnections; and wherein the second sidewall of each semiconductor pattern is inclined with respect to the top surface of a respective one of the lower interconnections.

5. The semiconductor device of claim 1, further comprising:

mold patterns disposed between ones of the semiconductor patterns that are arranged in a first direction, the mold patterns covering the first sidewalls of the semiconductor patterns; and filling patterns disposed between ones of the semiconductor patterns that are arranged in a second direction that is perpendicular to the first direction, the filling patterns covering the second sidewalls of the semiconductor patterns, and the filling patterns extending in the second direction.

6. The semiconductor device of claim 5, wherein sidewalls of the mold patterns that are adjacent to the first sidewalls of the semiconductor patterns are inclined with respect to the top surface of respective ones of the lower interconnections.

7. The semiconductor device of claim 6, further comprising:

a plurality of buffer insulating patterns, wherein each buffer insulating pattern is disposed between a respective one of the mold patterns and the first sidewall of a respective one of the semiconductor patterns, wherein for each buffer insulating pattern an upper width thereof in the first direction is greater than a lower width thereof in the first direction.

8. The semiconductor device of claim 1, wherein each semiconductor pattern includes an upper dopant region and a lower dopant region, wherein the conductivity type of the upper dopant region is different from the conductivity type of the lower dopant region; and wherein the upper and lower dopant regions constitute a PN diode or PIN diode to function as the selection component.

9. The semiconductor device of claim 1, wherein each memory component includes at least one of chalcogenides, perovskite compounds, transition metal oxides, ferromagnetic materials, anti-ferromagnetic materials and ferroelectric materials.

10. A semiconductor device, comprising:

a first lower interconnection;

a second lower interconnection that is spaced apart from the first lower interconnection;

an upper interconnection that crosses over both the first lower interconnection and the second lower interconnection;

a selection component and a memory component that are disposed in series between the first lower interconnection and the upper interconnection, wherein the memory component is disposed between the selection component and the upper interconnection and the selection component is disposed between the memory component and the first lower interconnection, wherein the selection component includes a semiconductor pattern having a first sidewall and a second sidewall;

wherein the first sidewall of the semiconductor pattern has a first upper width and a first lower width that is greater than the first upper width; and wherein the second sidewall of the semiconductor pattern has a second upper width and a second lower width that is substantially equal to the second upper width.

11. The semiconductor device of claim 10, wherein the first sidewall and the second sidewall share a common edge.

12. The semiconductor device of claim 10, further comprising a device isolation pattern in the semiconductor substrate, wherein a top surface of the first lower interconnection is at a lower level than a top surface of the device isolation pattern.

13. The semiconductor device of claim 10, further comprising:

a first device isolation pattern on a first side of the first lower interconnection;

a second device isolation pattern on a second side of the first lower interconnection;

a mold pattern on the first device isolation pattern;

a filling pattern on the second device isolation pattern; and a buffer insulating layer on the first lower interconnection between the selection component and the mold pattern.

14. The semiconductor device of claim 13, wherein an upper width of the mold pattern is less than a lower width of the mold pattern, and wherein an upper width of the buffer insulating pattern is greater than a lower width of the buffer insulating pattern.

* * * * *